(12) United States Patent
Verheyen et al.

(10) Patent No.: US 11,322,672 B2
(45) Date of Patent: May 3, 2022

(54) INTEGRATED THERMOELECTRIC STRUCTURE, METHOD FOR MANUFACTURING AN INTEGRATED THERMOELECTRIC STRUCTURE, METHOD FOR OPERATING SAME AS A DETECTOR, THERMOELECTRIC GENERATOR AND THERMOELECTRIC PELTIER ELEMENT

(71) Applicants: Fraunhofer-Gesellschaft zur Foerderung der angewandten Forschung e.V., Munich (DE); Universitaet Duisburg-Essen, Duisburg (DE)

(72) Inventors: Erik Verheyen, Duisburg (DE); Tobias Kleinfeld, Duisburg (DE); Dirk Weiler, Herne (DE); Holger Vogt, Muehlheim (DE)

(73) Assignees: Fraunhofer-Gesellschaft zur Foerderung der angewandten Forschung e.V., Munich (DE); Universitaet Duisburg-Essen, Duisburg (DE)

( * ) Notice: Subject to any disclaimer, the term of this patent is extended or adjusted under 35 U.S.C. 154(b) by 46 days.

(21) Appl. No.: 15/583,066

(22) Filed: May 1, 2017

(65) Prior Publication Data
US 2017/0317260 A1 Nov. 2, 2017

(30) Foreign Application Priority Data
May 2, 2016 (DE) .................... 10 2016 207 551.9

(51) Int. Cl.
*H01L 35/32* (2006.01)
*H01L 35/30* (2006.01)
*H01L 35/34* (2006.01)

(52) U.S. Cl.
CPC .............. *H01L 35/32* (2013.01); *H01L 35/30* (2013.01); *H01L 35/34* (2013.01)

(58) Field of Classification Search
CPC .......... H01L 35/30; H01L 35/32; H01L 35/34
See application file for complete search history.

(56) References Cited

U.S. PATENT DOCUMENTS

| 6,441,368 B1 * | 8/2002 | Grinberg | G01J 5/08 |
| | | | 250/216 |
| 2006/0102224 A1 * | 5/2006 | Chen | H01L 35/16 |
| | | | 136/203 |

(Continued)

FOREIGN PATENT DOCUMENTS

| WO | 2016046713 A1 | 3/2016 |
| WO | 2016055892 A1 | 4/2016 |

OTHER PUBLICATIONS

Namigo, E. L. , "Characterization of in-situ doped poly-SiGe thermoelectric materials", The 4th International Conference on Theoretical and Applied Physics (ICTAP) 2014, Mar. 2016 , pp. 030013-1-030013-4.

(Continued)

*Primary Examiner* — Lindsey A Bernier
(74) *Attorney, Agent, or Firm* — Perkins Coie LLP; Michael A. Glenn

(57) ABSTRACT

Described is an integrated vertical structure for infrared sensors, Peltier cooling, and thermoelectric generator applications consisting of a thermally insulating layer which is kept at a distance to a substrate by at least two spacers. In addition, the spacers have conductor structures which serve as thermoelectric elements.
A method realizes manufacturing the integrated thermoelectric structure, a method realizes the operation of the integrated thermoelectric structure as a detector, a further method realizes the operation of the integrated thermoelec- (Continued)

tric structure as a thermoelectric generator, and a method realizes the operation of the integrated thermoelectric structure as a thermoelectric Peltier element.

24 Claims, 12 Drawing Sheets

(56) References Cited

U.S. PATENT DOCUMENTS

| | | | | |
|---|---|---|---|---|
| 2007/0261730 A1* | 11/2007 | Seker | ............... | H01L 35/30 |
| | | | | 136/224 |
| 2007/0277866 A1* | 12/2007 | Sander | ............... | H01L 35/32 |
| | | | | 136/230 |
| 2009/0260667 A1* | 10/2009 | Chen | ............... | H01L 35/00 |
| | | | | 136/201 |
| 2011/0315882 A1* | 12/2011 | Hu | ............... | B82Y 30/00 |
| | | | | 250/353 |
| 2014/0246066 A1* | 9/2014 | Chen | ............... | H01L 35/34 |
| | | | | 136/212 |
| 2014/0246749 A1 | 9/2014 | Nam et al. | | |

OTHER PUBLICATIONS

Wick, M. et al., "Design and Analysis of Novel Micromachined Thermocouples With Vertical Free-Standing High-Aspect-Ratio Geometry", Journal of Electronic Materials; vol. 44; No. 6;, Mar. 2015, pp. 2146-2150.

* cited by examiner

Process flow

| | |
|---|---|
| 1-4) | Patterning the metal electrodes on the wafer and, maybe, electrical contact to evaluating electronics in the wafer processed before |
| 4.x) | Reflector and gate (optional): |
| 4.1) | Applying a sacrificial material, e.g. polyimide, Si, $SiO_2$, nitride, at a desired height |
| 4.2-4.4) | Patterning the spacers (holes or the like) for the reflector |
| 4.5) | Metallization using atomic layer deposition (ALD) or physical vapor deposition (PVD) so that a layer having an electrical resistance of only a view ohm results as the reflector |
| 4.6-4.8) | Patterning the holes in the metal layer manufactured in 1.5 for the spacers of the membrane (absorber) and, subsequently, deep-etching to the contact areas on the wafer |
| 5) or 4.9) | Applying a sacrificial material, e.g. polysilicon, so that the desired distance to the reflector ($\lambda/4$) and/or to the substrate (8 μm - 12 μm) results |
| 6-8) | Patterning the holes and deep-etching to the metal contacts manufactured in 1.4 (at the positions having been manufactured in 4.1 - 4.9, in the case of a resonator or gate structure) |
| 9) | Manufacturing the membrane, e.g. by means of PVD of metal (Al or Ti), without coating the lateral areas of the holes (process step may also take place later) |
| 10) | Sealing the holes near the surface, e.g. by a photoresist or suitable SiO2 processes |
| 11) | Etching/exposing a hole in order to open same for processing |
| 12) | Coating by means of ALD using material 1, the result being a pipe in the hole patterned before |
| optional: | $AL_2O_3$ layer or similar material is applied by means of ALD as a protection of the active ALD layer from a future release step, before and after coating using material 1 or material 2 |
| 13-15) | Removing the ALD layer, not required, of material 1 and photoresist/SiO2 |
| 16-20) | Identical processing like in steps 10 - 15 for material 2 and the other hole patterned before |
| 21) | Releasing the layer, etching away the sacrificial material layer such that the result is a free-standing structure. Without a reflector a) or with a reflector or gate b) |

Fig. 10

INTEGRATED THERMOELECTRIC STRUCTURE, METHOD FOR MANUFACTURING AN INTEGRATED THERMOELECTRIC STRUCTURE, METHOD FOR OPERATING SAME AS A DETECTOR, THERMOELECTRIC GENERATOR AND THERMOELECTRIC PELTIER ELEMENT

CROSS-REFERENCE TO RELATED APPLICATION

This application claims priority from German Application No. 10 2016 207 551.9, which was filed on May 2, 2016, and is incorporated herein by reference in its entirety.

BACKGROUND OF THE INVENTION

An embodiment of the present invention relates to an integrated thermoelectric structure. Further embodiments relate to methods for manufacturing an integrated thermoelectric structure, a method for operating same as a detector, a method for operating same as a thermoelectric generator, and a method for operating same as a Peltier element.

Detecting infrared radiation is an important field of application which is employed in contactless temperature measurement, for example. False-color imaging devices which allow mapping a temperature distribution on the surface of an object also belong to this field.

At present, bolometers are mainly used for infrared sensor arrays since these may at present be patterned in a comparatively small manner and thus may be united more easily to form a pixel array. In accordance with the Yole Report and current literature, the next sensor size is 12 µm·12 µm and, in future, 6 µm·6 µm. However, bolometers are of disadvantage in that they "produce" additional noise (1/f noise).

Furthermore, it is possible to use thermopiles. Compared to bolometers, these are of advantage in that 1/f noise is not the main source in thermopiles. The main problem of thermopiles at present is their integration size on a semiconductor wafer. At present, the sensor areas are larger than 20 µm·20 µm and exhibit a thermoelectric pattern in a lateral direction (additional space requirements).

A vertical approach in literature suggests performing processing by etching on the back side, thereby allowing a 3D structure, however, again at a loss in area, wherein the thermal conductivity is increased considerably by this patterning method.

Another publication aims at a different approach. The article "DESIGN AND ANALYSIS OF NOVEL MICROMACHINED THERMOCOUPLES WITH VERTICAL FREE-STANDING HIGH-ASPECT-RATIO GEOMETRY" by M. Wick, H. Hedler and H. Seidel (published in: Journal of ELECTRONIC MATERIALS, Vol. 44, No. 6, 2015) describes the design and analysis of free-standing three-dimensional thermocouples for uncooled high-resolution imaging methods for infrared applications. In contrast to conventional horizontal thermocouples, the thermocouples described in this article consist of vertically oriented coaxial legs which are covered by an infrared absorber area.

In view of the above expositions, it is desirable to provide an integrated thermoelectric structure, methods for manufacturing and operating methods which offer an improved compromise as regards manufacturing costs, integration size and efficiency.

In addition, it is desirable to provide an integrated vertical thermoelectric structure for infrared sensors, Peltier cooling and thermoelectric generator applications.

SUMMARY

According to an embodiment, an integrated thermoelectric structure may have: a substrate; and a layer; and at least two spacers, wherein the spacers have conductor structures, wherein a conductor structure of a first spacer has a material having a first Seebeck coefficient; and wherein a conductor structure of a second spacer has a material having a second Seebeck coefficient which differs from the first Seebeck coefficient; and wherein the spacers are perpendicular to a main surface of the substrate with a tolerance of +1-45 degrees; and wherein the conductor structure of the first spacer is coupled electrically to the conductor structure of the second spacer; and wherein the spacers are configured to keep the layer at a distance to the substrate.

According to another embodiment, a method for manufacturing an integrated thermoelectric structure on a substrate may have the steps of: manufacturing a first spacer which has a first conductor structure, wherein the first conductor structure has a material having a first Seebeck coefficient, and wherein the first spacer is manufactured such that the first spacer is perpendicular to a main surface of the substrate with a tolerance of +/−45 degrees; manufacturing a second spacer which has a second conductor structure, wherein the second conductor structure has a material having a second Seebeck coefficient which differs from the first Seebeck coefficient, and wherein the second spacer is manufactured such that the second spacer is perpendicular to the main surface of the substrate with a tolerance of +/−45 degrees; manufacturing a layer; wherein the first spacer, the second spacer and the layer are manufactured such that the conductor structure of the first spacer is coupled electrically to the conductor structure of the second spacer, and such that the layer is kept at a distance to the substrate by the spacers.

Another embodiment may have a method for operating an integrated thermoelectric structure having: a substrate; and a layer; and at least two spacers, wherein the spacers have conductor structures, wherein a conductor structure of a first spacer has a material having a first Seebeck coefficient; and wherein a conductor structure of a second spacer has a material having a second Seebeck coefficient which differs from the first Seebeck coefficient; and wherein the spacers are perpendicular to a main surface of the substrate with a tolerance of +/−45 degrees; and wherein the conductor structure of the first spacer is coupled electrically to the conductor structure of the second spacer; and wherein the spacers are configured to keep the layer at a distance to the substrate; and a reflector; and wherein the reflector is arranged in a region between the layer and the substrate; and wherein the reflector has a reflector area parallel to a main surface of the substrate with a tolerance of +/−10 degrees; and wherein a spectral peak to be detected has a predetermined wavelength; and wherein a distance between the reflector area and the layer, with a tolerance of 10% of the predetermined wavelength, equals an odd-numbered multiple of a fourth of the predetermined wavelength.

According to still another embodiment, a detector for detecting electromagnetic radiation may have: an integrated thermoelectric structure as mentioned above; an evaluating circuit configured to evaluate an electrical voltage resulting between substrate-side and/or layer-side terminals of the first spacer and the second spacer in order to obtain information on layer heating caused by the incident electromagnetic radiation.

According to another embodiment, a thermoelectric generator for transforming heat to electrical energy may have: an integrated thermoelectric structure as mentioned above; and a circuit configured to tap an electrical voltage resulting between the substrate-side and/or layer-side terminals of the first spacer and the second spacer in order to make available electrical energy.

According to another embodiment, a thermoelectric Peltier element for transporting heat may have: an integrated thermoelectric structure as mentioned above; and a circuit configured to impress an electrical current across the conductor structure of the first spacer and across the conductor structure of the second spacer in order to transport heat.

An embodiment of the present invention provides an integrated thermoelectric structure comprising a substrate and a layer kept at a distance by at least two spacers. The spacers comprise conductor structures, wherein a conductor structure of a first spacer comprises a material having a first Seebeck coefficient. A second spacer comprises a conductor structure, the conductor structure of the second spacer comprising a material having a second Seebeck coefficient. The second Seebeck coefficient differs from the first Seebeck coefficient. Furthermore, the spacers are manufactured such that they are perpendicular to a main surface of the substrate with a tolerance of +/−45 degrees, wherein an implementation with a tolerance of +/−30 degrees may also be of advantage. The conductor structure of the first spacer and the conductor structure of the second spacer are coupled electrically and the spacers are additionally configured to keep the layer at a distance to the substrate.

Thus, using the design presented here, sensors of a smaller total size may, for example, be produced since the space requirements for lateral support structures can be omitted. The vertical structure described above is generated, wherein a minimum sensor area possible here may be reduced considerably (for example due to the thermal insulation). Thermal insulation may, for example, be achieved by using the spacers. In addition, using two basically vertical spacers is of advantage since these can ensure high stability. At the same time, the spacers are not only used for thermal insulation but may rather also act as a thermocouple. Thus, a number of at least two spacers is sensible here, too. An improvement in insensitivity to moment load is, for example, also achieved by a number of at least two spacers.

In accordance with an embodiment of the integrated thermoelectric structure, the spacer comprises a base area, a lateral area and, in a region facing away from the substrate, a top area bordering on the lateral area, surrounding a central region of the spacer, parallel to the main surface of the substrate with a tolerance of +/−10 degrees. This offers the advantage that the spacers, due to thin-wall manufacturing, exhibit a low thermal conductivity and, at the same time, high mechanical stability. In addition, the layer may be mounted easily due to the "hat-type" structure, i.e. the order or succession of base area, lateral area and top area, which would correspond to the brim of the hat. This good mechanical contacting in turn provides for a considerable increase in stability. Electrical contacting can also be improved considerably by the top area. Another aspect is that the entire spacer, consisting of base area, lateral area and top area, may be manufactured integrally. This makes processing easier and also provides for increased stability. The base area of the spacers also offers advantages, it provides for improved electrical contacting of the spacer to a contact area maybe present on the substrate, for example.

In accordance with another embodiment of the integrated thermoelectric structure, the first and second spacers are arranged next to each other. This offers the advantage that these are easier to be contacted electrically due to the spatial separation. The spatial separation also improves manufacturability since geometrically similar spacers, or spacers which are geometrically identical except for the material, can be processed, at a distance chosen.

In accordance with another embodiment, the top area of the spacer abuts on the layer in an overlapping manner so as to support the layer and/or contact same electrically. This offers the advantage of combining two different functions in one component of the spacer. The top area here may be provided both for mechanical fixing of the layer and also for electrical contacting.

In accordance with another embodiment of the integrated thermoelectric structure, the spacers are grown on electrical contacts. This offers the advantage that the integrated thermoelectric structure may be grown on a circuit processed already, wherein this circuit may, for example, be evaluating electronics for the integrated thermoelectric structure. Thus, it is, for example, also possible to manufacture the integrated thermoelectric structure on CMOS circuits and thus use materials unusual for CMOS. This offers a way of using desired materials in another field, which, compared to conventional CMOS materials, may comprise improved thermoelectric and mechanical characteristics, for example.

In accordance with another embodiment of the integrated thermoelectric structure, same comprises at least four spacers, wherein the conductor structures of the spacers are connected in series. Furthermore, two consecutive conductor structures in the series connection each comprise materials having different Seebeck coefficients. This offers the advantage that the electrical voltage resulting typically is double as high compared to a single thermoelectric couple. In addition, the mechanical stability of the structure is increased further.

In accordance with another embodiment of the integrated thermoelectric structure, the conductor structures of the spacers are contacted electrically on the side of the substrate and/or on the side of the layer. Thus, the integrated thermoelectric structure may be provided with an external wiring. There is, for example, no restriction to a circuit in the substrate, rather it is possible to apply wiring on the layer as well.

In accordance with another embodiment of the integrated thermoelectric structure, the spacers are completely or partly hollow on the inside, or the interior of the spacers is filled by a material the thermal conductivity of which is smaller than a thermal conductivity of a respective material of the lateral area of the spacers. This offers the advantage that the thermal conductivity of the spacers may be reduced and, at the same time, mechanical stability be increased.

In accordance with another embodiment of the integrated thermoelectric structure, the conductor structure of the first spacer and the conductor structure of the second spacer form a thermoelectric couple. This offers the advantage that two separate characteristics or tasks, i.e. on the one hand generating the distance between the layer and the substrate and the fact that the spacers are the active elements of the thermoelectric structure on the other hand, may be united in the structure of the spacers.

In accordance with another embodiment of the integrated thermoelectric structure, the conductor structure of the first spacer and the conductor structure of the second spacer consist of materials the Seebeck coefficients of which differ by at least 30 µV/K, advantageously 100 µV/K. This offers the advantage that the voltage setting, for example, may become sufficiently large and, thus, the sensitivity may reach an advantageous value in sensor applications.

In accordance with another embodiment of the integrated thermoelectric structure, the first spacer, in a top region facing away from the substrate turns into a first layer portion of the layer, and the second spacer, in a top region facing away from the substrate, also turns into a second layer portion of the layer. Thus, the first layer portion and the second layer portion contact and/or overlap each other. Furthermore, the first layer portion and the second layer portion may be connected electrically. This offers the advantage that the layer may be formed from parts of the spacers and, thus, at least one manufacturing step may be omitted. In addition, transition resistances can be avoided by this.

In accordance with another embodiment of the integrated thermoelectric structure, the integrated thermoelectric structure comprises a heat-conducting element which is coupled thermally to the layer to conduct heat away from the layer or conduct heat towards the layer. This offers the advantage that the integrated thermoelectric structure may be connected thermally to heat sources and/or to heat sinks and may, for example, function as a Peltier element or a thermoelectric generator.

In accordance with another embodiment of the integrated thermoelectric structure, the layer comprises a radiation absorption coefficient of at least 0.5. This offers the advantage that, for example with an infrared sensor application, the absorption of the radiation desired can be sufficiently large and, thus, the layer can heat up sufficiently.

In accordance with another embodiment of the integrated thermoelectric structure, another layer which comprises a radiation absorption coefficient of at least 0.5 is applied on the layer. This, for example, offers the advantage that the absorption is also increased, without having to compromise with the electric conductivity of the layer, for example.

In accordance with another embodiment of the integrated thermoelectric structure, a THz antenna is provided on the layer. This offers the advantage that the measuring range may additionally be supplemented to the THz range by the THz antenna.

In accordance with another embodiment of the integrated thermoelectric structure, a reflector is arranged in a region between the layer and the substrate. This offers the advantage that a resonator, for example, may be realized which allows wavelength-selective heating of the layer, for example. In addition, the reflector may allow radiation which penetrates the layer to be reflected back by the reflector and thus also to contribute to the layer heating up.

In accordance with another embodiment of the integrated thermoelectric structure, the reflector comprises a reflector area parallel to a main surface of the substrate with a tolerance of +/−10 degrees. This offers the advantage that the wavelength-selective heating of the layer, for example, can be improved further.

In accordance with another embodiment of the integrated thermoelectric structure, an edge of the reflector area is arranged to be a control structure so as to allow an electrical characteristic of the spacer to be influenced. This offers a way of using, for example, the reflector as a control terminal (gate) of a field-effect transistor of, for example, a vertical metal oxide semiconductor (MOS) transistor.

In accordance with another embodiment of the integrated thermoelectric structure, the reflector area is adjacent to at least one of the spacers so as to allow an electrical characteristic of the spacer to be influenced, or the reflector area is facing at least one of the spacers so as to allow an electrical characteristic of the spacer to be influenced. This offers the advantage that the charge carrier flow, or charge carrier concentration, in the spacer may be modulated, by a voltage applied to the reflector, for example.

In accordance with another embodiment of the integrated thermoelectric structure, an insulation layer which allows an electrical characteristic of the spacer to be influenced is provided between the reflector area and the spacer. This offers the advantage that the Seebeck coefficient, for example, can be modulated in time.

In accordance with another embodiment of the integrated thermoelectric structure, the spacer comprises a control electrode structure or gate structure. This offers the advantage that electrical and thermal characteristics of the spacers, for example, may be influenced.

Another embodiment of the invention provides a method for manufacturing an integrated thermoelectric structure. Thus, the method comprises the following steps, but not necessarily in the given order of execution: manufacturing a first spacer which comprises a first conductor structure, wherein the first conductor structure comprises a material having a first Seebeck coefficient, and wherein the first spacer is manufactured such that the first spacer is perpendicular to a main surface of the substrate with a tolerance of +/−45 degrees; manufacturing a second spacer which comprises a second conductor structure, wherein the second conductor structure comprises a material having a second Seebeck coefficient which differs from the first Seebeck coefficient, and wherein the second spacer is manufactured such that the second spacer is perpendicular to a main surface of the substrate with a tolerance of +/−45 degrees; and manufacturing a layer, the first spacer, the second spacer and the layer being manufactured such that the conductor structure of the first spacer is coupled electrically to the conductor structure of the second spacer and such that the layer is kept at a distance to the substrate by the spacers.

The method mentioned realizes the intended manufacturing of the integrated thermoelectric structure described above.

Another embodiment provides a manufacturing method, wherein the layer is manufactured before the spacers, and wherein the layer, before manufacturing the spacers, is supported by a sacrificial layer. Thus, manufacturing the spacer comprises the following step: applying the material having the first Seebeck coefficient so that the material having the first Seebeck coefficient contacts the layer from above and extends through a first opening in the layer and through a first opening in the sacrificial layer to the substrate or to a layer applied on the substrate. Manufacturing the second spacer comprises the following step: applying the material having the second Seebeck coefficient so that the material having the second Seebeck coefficient contacts the layer from above and extends through a second opening in the layer and through a second opening in the sacrificial layer to the substrate or to a layer applied on the substrate. The sacrificial layer is removed after manufacturing the first and second spacers. This manufacturing method may, for example, offer the advantage that the layer and the respective spacers can be contacted very well. The mechanical connection between the layer and the spacers may, for example, also be improved.

Another embodiment of the invention provides a method for manufacturing an integrated thermoelectric structure. Thus, an integrated circuit is formed on the substrate before manufacturing the spacers.

Another embodiment of the invention provides a method for manufacturing an integrated thermoelectric structure. In this method, the spacers are formed on the contact areas which are connected to electrical conductor structures.

Another embodiment provides a method for operating an integrated thermoelectric structure. The integrated thermoelectric structure thus comprises a substrate, a layer and at least two spacers. These spacers comprise conductor structures and a conductor structure of a first spacer comprises a material having a first Seebeck coefficient. The conductor structure of a second spacer comprises a material having a second Seebeck coefficient which differs from the first Seebeck coefficient. Thus, the spacers are perpendicular to a main surface of the substrate with a tolerance of +/−45 degrees, wherein an implementation with a tolerance of +/−30 degrees may be of advantage. The conductor structure of the first spacer is coupled electrically to the conductor structure of the second spacer and the spacers are configured to keep the layer at a distance to the substrate. Furthermore, the structure comprises a reflector, the reflector being arranged in a region between the layer and the substrate. Thus, the reflector comprises a reflector area parallel to a main surface of the substrate with a tolerance of +/−10 degrees. Radiation to be detected comprises a spectral maximum of a predetermined wavelength and the distance between the reflector area and the layer equals and odd-numbered multiple of a fourth of the predetermined wavelength, with a tolerance of 10%, advantageously a tolerance of 5% of the predetermined wavelength.

The method mentioned realizes the intended operation of the integrated thermoelectric structure described above. In particular, a standing wave may form here, the wave loop of which may result in a particularly efficient heating of the layer.

Another embodiment provides a method for operating an integrated thermoelectric structure as a detector for detecting electromagnetic radiation. An integrated thermoelectric structure and a circuit configured to evaluate an electrical voltage which results between substrate-side and/or layer-side terminals of the first spacer and the second spacer are used here in order to obtain information on heating of the layer caused by incident electromagnetic radiation.

Another embodiment provides a method for operating an integrated thermoelectric structure as a thermoelectric generator for converting heat to electrical energy. An integrated thermoelectric structure and a circuit configured to tap an electrical voltage resulting between the substrate-side and/or layer-side terminals of the first spacer and the second spacer are used here in order to make electrical energy available.

Another embodiment provides a method for operating an integrated thermoelectric structure as a thermoelectric Peltier element for transporting heat. An integrated thermoelectric structure and a circuit configured to impress an electrical current across the conductor structure of the first spacer and across the conductor structure of the second spacer are used here in order to transport heat.

BRIEF DESCRIPTION OF THE DRAWINGS

Embodiments of the present invention will be detailed subsequently referring to the appended drawings, in which:

FIG. 10 is a tabular chart of a process flow for manufacturing an integrated thermoelectric structure;

DETAILED DESCRIPTION OF THE INVENTION

Figure 1:
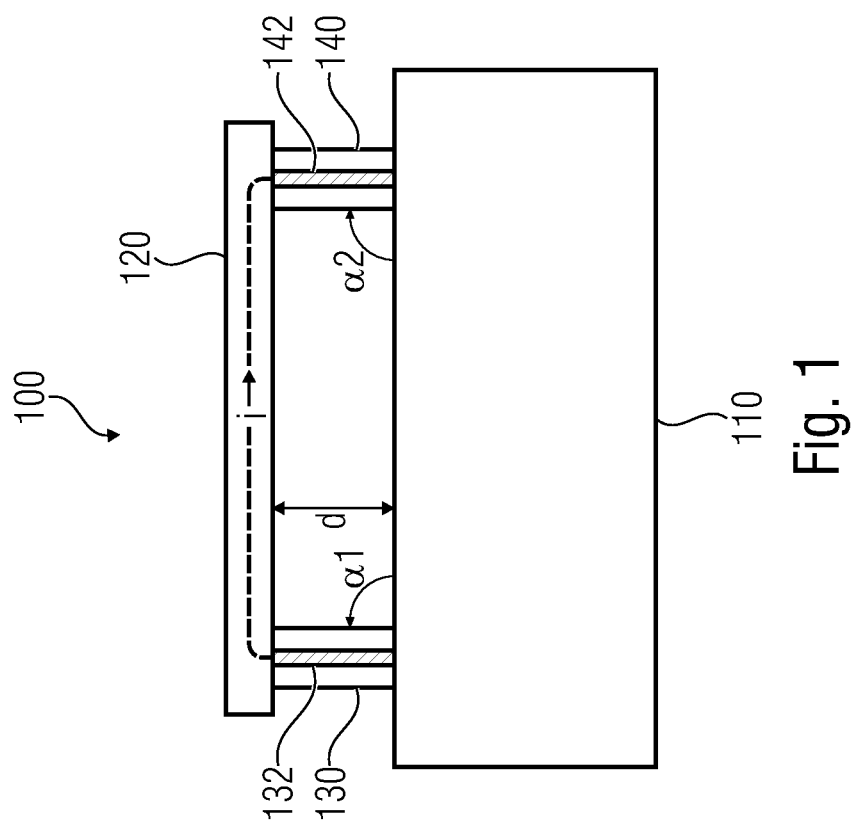
FIG. 1 is a schematic sectional view of an integrated thermoelectric structure in accordance with a first embodiment of the present invention.

Embodiment in Accordance with FIG. 1

FIG. 1 shows a schematic sectional view of an integrated thermoelectric structure 100 in accordance with a first embodiment of the present invention. The integrated thermoelectric structure 100 is configured to be applied as an infrared sensor, Peltier element and/or thermoelectric generator, for example. The integrated thermoelectric structure 100 comprises a substrate 110, a layer 120 and at least two spacers 130, 140, wherein the spacers 130, 140 comprise conductor structures 132, 142, wherein a conductor structure 132 of a first spacer 130 comprises a material having a first Seebeck coefficient. A conductor structure 142 of a second spacer 140 comprises a material having a second Seebeck coefficient which differs from the first Seebeck coefficient. The spacers 130, 140 are perpendicular to a main surface of the substrate 110 with a tolerance of +/−45 degrees, wherein an implementation with a tolerance of +/−30 degrees may also be of advantage. The conductor structure 132 of the first spacer 130 is coupled electrically to the conductor structure 142 of the second spacer 140. The spacers 130, 140 are configured to keep a layer 120 at a distance to the substrate 110. In addition, the spacers 130 and 140 are arranged at a distance to each other. The layer 120 is generally parallel to a main surface of the substrate 110 with a tolerance of +/−10 degrees. A middle surface is referred to as a main surface of the substrate 110, which is averaged over the generally not perfectly smooth surface of the substrate 110 which may exemplarily comprise elevated and lower regions caused by further structures on and/or in the substrate 110. Furthermore, the layer 120 extends beyond the region supported by the spacers 130, 140.

In other words, a thermally insulated absorber area, i.e. the layer 120 which may be electrically conductive, is supported by the spacers 130, 140, wherein the spacers 130, 140 or the conductor structures 132, 142 thereof are electrically conductive and consist of two different materials. The different materials additionally comprise different Seebeck coefficients and are exemplarily connected electrically to each other via an ohmic contact or several ohmic contacts at the membrane, i.e. the layer 120, so that several spacers 130, 140 may be electrically connected in series/parallel below a membrane.

Using the design presented here, sensors of a smaller total size when compared to conventional thermopiles may be manufactured. The integrated thermoelectric structure 100 is produced, which is how the minimum sensor area possible may be reduced, due to the thermal insulation of the layer 120 from the substrate 110. The sensor detecting capability here is limited mainly by the lithographic pattern width. By processing using atomic layer deposition (ALD), it is possible to produce very thin structures, thereby reducing the thermal conductivity of the spacers 130, 140. In addition, ALD allows using material systems for the spacers which are not conventional in CMOS, like Bi2Te3, for example, with a good thermoelectric quality factor (zT value).

The area on the wafer is reduced further by the vertical structure, or the vertical setup of the integrated thermoelectric structure, for example by the basically "vertical" spacers 130, 140, i.e. basically perpendicular to the main surface of the substrate 110, and thus costs are saved. In addition, it may be possible to produce these thermopile structures on different substrates 110, i.e., for example, on substrates made of different materials. In addition, the thermoelectrically active layers, i.e. the conductor structures 132, 142 of the spacers 130, 140, may be formed to be "longer", without increasing the sensor area, as is the case in conventional thermopiles. Thus, the temperature difference for operation may be increased further. The very precise vertical structuring, the electrical connection of the thermopiles (number of elements) and the resulting connection to structures below, for example to evaluating electronics, and, above all, CMOS compatibility, are new facts for thermopiles. Using this design, reproducible sensors of high detecting capability which are CMOS-compatible and cost-efficient can be manufactured.

Figure 2:
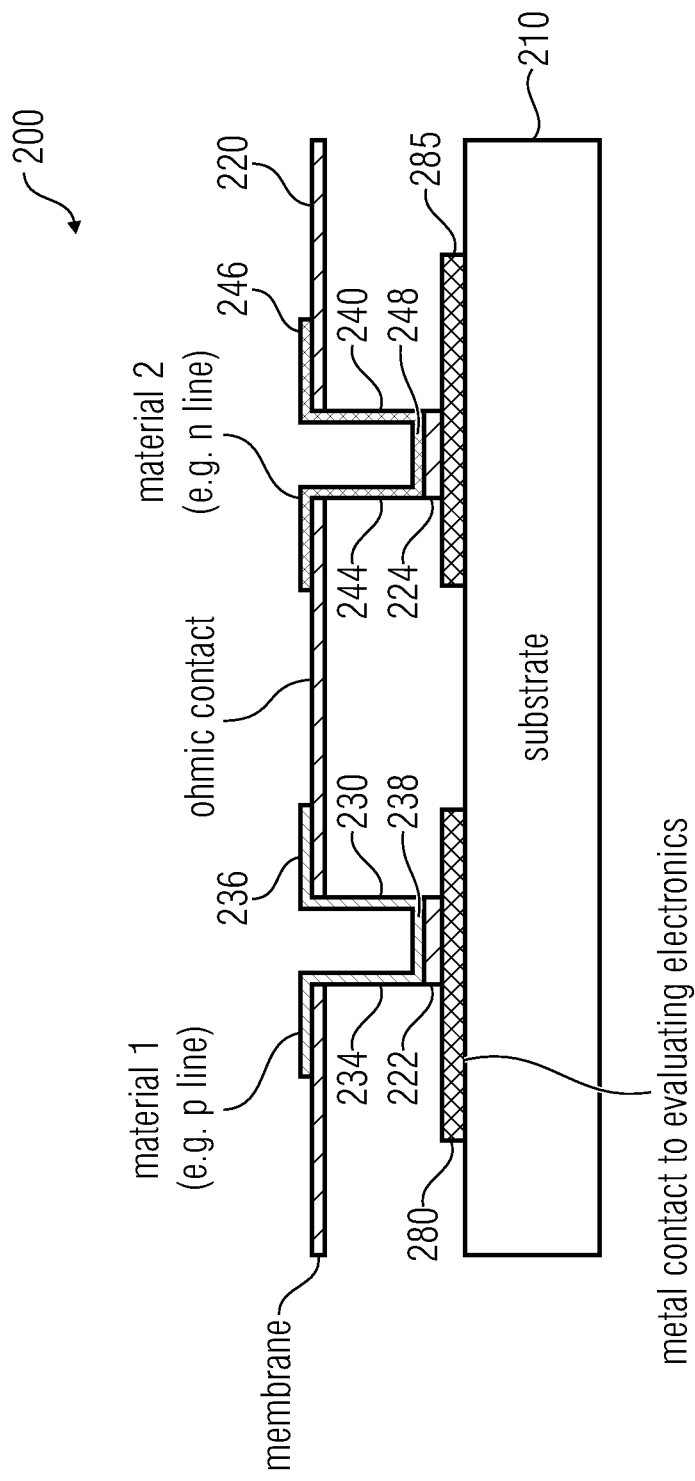
FIG. 2 is a schematic sectional view of an integrated thermoelectric structure in accordance with a second embodiment of the present invention.

Embodiment in Accordance with FIG. 2

FIG. 2 shows a schematic sectional view of an integrated thermoelectric structure 200 in accordance with a second embodiment of the present invention. The integrated thermoelectric structure 200 here comprises a substrate 210, a layer or membrane 220, and at least two spacers 230, 240. A first spacer 230 comprises a base area 238, a lateral area 234 and, in a region facing away from the substrate 210, a top area 236 bordering on the lateral area 234, surrounding a central region of the spacer 230 and parallel to the main surface of the substrate 210 with a tolerance of +/−10 degrees. A second spacer 240 comprises a base area 248, a lateral area 244 and, in a region facing away from the substrate 210, a top area 246 bordering on the lateral area 244, surrounding a central region of the spacer 240 and parallel to the main surface of the substrate 210 with a tolerance of +/−10 degrees. Additionally, the spacers 230, 240 either comprise conductor structures having different Seebeck coefficients or consist of materials having different Seebeck coefficients. In addition, the integrated thermoelectric structure 200 comprises a first conductive area 280 associated to the first spacer 230, or the conductor structure of the first spacer 230, and coupled electrically to the first spacer 230 or the conductor structure of the first spacer 230. A second conductive area 285 is associated to the second spacer 240, or the conductor structure of the second spacer 240. The second conductive area 285 is coupled electrically to the second spacer 240, or the conductor structure of the second spacer 240. Between the spacers 230, 240, the substrate 210 basically extends in parallel to the layer 120, i.e. with a tolerance of +/−10%.

Another layer 222, 224 comprising the same material as the layer 220 may be located between the base areas 238, 248 of the spacers 230, 240 and the respective conductive area 280, 285. This further layer 222, 224 may be the result of the succession and approach of processing selected in the embodiment so that the spacers 230, 240 were processed in time after the layer 220 and, thus, after the further layers 222, 224.

The setup of the spacer 230 and, in analogy, the setup of the spacer 240 may be represented as a cylinder open at the top, i.e. having a (cylinder) base area 238 and a (cylinder) lateral area 234. The top layer 236 is formed as a broad rim around the exterior of the (cylinder) lateral area 230. Thus, the spacer is basically rotationally symmetric, i.e. with a tolerance of +/−25%.

The spacer 230, 240 may generally be a "general" cylinder open at the top (for example having a non-circular base area 238), wherein the lateral area of the cylinder 234 on the outside is surrounded, in a top region, by an edge area 236 which is essentially in parallel to the cylinder base area 238, or main surface of the substrate 210.

It would be conceivable to grow the spacers 230, 240 onto conductive areas 280, 285 processed already. This offers the advantage of making use of structures processed already in the substrate 210, like evaluating electronics, for example. FIG. 2 also illustrates that the top area 236 of the first spacer 230 abuts on the layer 220 in an overlapping manner. It is also illustrated that the top area 246 of the second spacer 240 abuts on the layer 220 in an overlapping manner. This offers a way for the top areas 236, 246 of the spacers 230, 240 to support and/or contact electrically the layer 220. Thus, it is not predetermined whether the spacers 230, 240 carry the layer 220 from above or support same from below. Both embodiments may comprise advantages with electrical contacting, with mechanical stability or manufacturing, for example. The relation between the spacers 230, 240 and the area 220 may, for example, be determined by the order when processing, i.e. whether the spacers 230, 240 are processed in time before or after the layer 220, for example.

In the implementation of the integrated thermoelectric structure 200 illustrated, it would be conceivable to electrically connect the conductor structures of the spacers 230, 240 in series. An extension of the integrated thermoelectric structure 200 would be for the integrated thermoelectric structure 200 to comprise at least 4 spacers 230, 240 and for the conductor structures of the spacers 230, 240 to be connected in series. Thus, two successive conductor structures of the spacers 230, 240 in the series connection each comprise materials having different Seebeck coefficients.

In the integrated thermoelectric structure 200, it is possible for the conductor structure of the first spacer 230 together with the conductor structure of the second spacer 240 to form a thermoelectric couple, due to the difference of the specific Seebeck coefficients. The integrated thermoelectric structure 200 may also be understood to be a basic setup of an infrared sensor, a thermoelectric generator or a Peltier cooler. Materials 1 and 2 exemplarily represent the spacers 230, 240 between the membrane, i.e. the layer 220, and the substrate 210 and may at the same time be active structures for the application scenarios as mentioned above. The ohmic contact is provided at the membrane, i.e. the layer 220, so that additional spacers 230, 240 may be connected electrically as desired, either in series and/or parallel.

Instead of additionally applied electrical contacts, it is conceivable for the membrane, i.e. the layer 220, to serve also as an electrical contact between the individual spacers 230, 240. This allows further reducing the thermal mass. This may result in a faster response characteristic in a detection application, for example.

The spacers 230, 240 correspond to the spacers 130, 140 in FIG. 1. This specific implementation of the spacers is not predetermined. Rather, it is desired for the spacers 230, 240 to meet the basic characteristics and tasks of spacers, i.e. achieve mechanical stability and at the same time be active thermoelectric elements and spacers between the layer 220 and the substrate 210.

Figure 3:
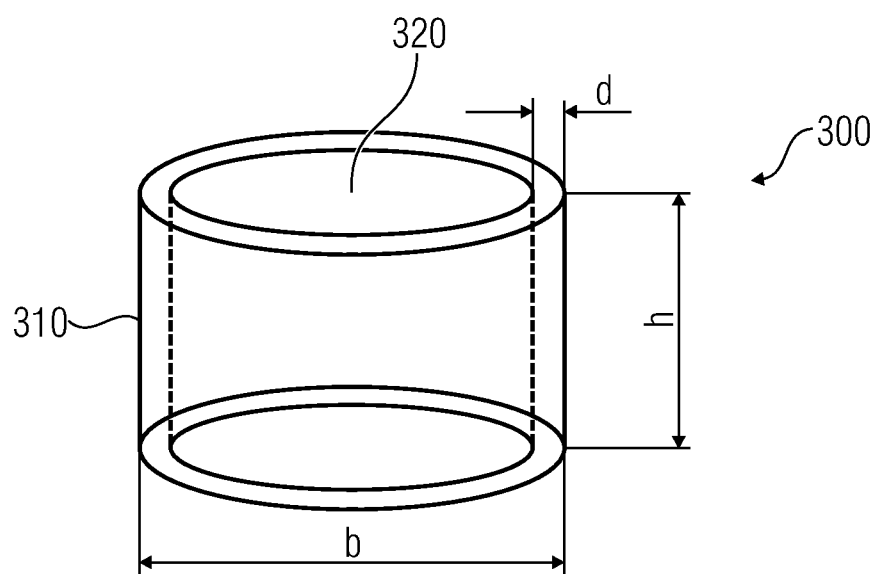
FIG. 3 is an oblique view of a basic setup of a spacer of an integrated thermoelectric structure.

Embodiment in Accordance with FIG. 3

FIG. 3 shows an oblique view of a spacer 300 of an integrated thermoelectric structure. The spacer 300 here comprises a lateral area 310 and an interior 320. It is also possible for the spacer 300 to comprise a base area and, in a region facing away from the substrate, a top area bordering on the lateral area 310, surrounding a central region of the spacer 300, parallel to the main surface of the substrate with a tolerance of +/−10 degrees. Thus, FIG. 3 represents the basic setup of a spacer 300 comprising the height h, the external diameter b and the thickness of the "envelope" (or lateral area) d.

The spacer 300 here may be processed such that the spacer 300 is completely or partly hollow on the inside, or such that the interior 320 of the spacer 300 is filled by a material the thermal conductivity of which is lower than a thermal conductivity of a respective material of the lateral area 310 of the spacer 300. The desired thermal conductivity of a material which fills the interior 320 may, for example, be smaller than $1/10$ of the thermal conductivity of the material of the lateral area 310, wherein the material of the lateral area is electrically conductive, for example, and may comprise the first Seebeck coefficient at the first spacer and the second Seebeck coefficient at the second spacer.

This offers the advantage that a mechanical stability of the spacer 300 may be ensured, with a potential decrease in the thermal conductivity of the spacer 300. The dimensions of the spacer may be referred to by height h, external diameter b and layer thickness of the lateral area d.

Expressed in other words: The spacers may be thin-walled structures hollow on the inside (tubes), wherein the thermal conductivity from the layer (membrane) towards the substrate may be reduced. The layer thicknesses d of the spacers (tubes) may, with a monolayer, be up to 200 nm, but advantageously are between 5 nm and 50 nm. The external diameter b of these structures may be in a range between 50 nm and 400 nm, for example, and may be dependent only on the lithographic resolution used. The height h of these tubes is to be as large as possible in order to further reduce the thermal conductivity and to achieve the largest temperature difference possible. Typical heights h are between 1.0 μm and 40 μm, for example, wherein the height h may be in a range between 5 μm and 20 μm for sensor applications.

The spacer 300 shown in FIG. 3 exemplarily corresponds to the spacers 230, 240 of FIG. 2, and also to the spacers 130, 140 of FIG. 1, except for the fact that FIG. 3 does not reveal the base area and the top area. However, it may be stated that it is desired for the spacer 300 to meet the basic characteristics and tasks of spacers as mentioned before.

Figure 4:
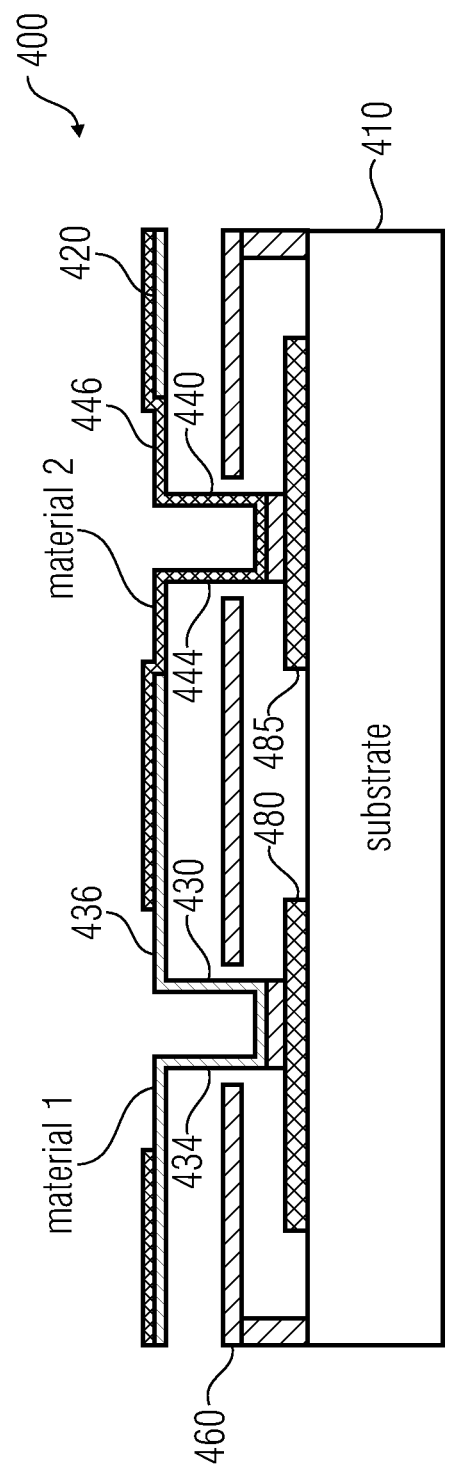
FIG. 4 is a schematic sectional view of an integrated thermoelectric structure in accordance with a third embodiment of the present invention.

Embodiment in Accordance with FIG. 4

FIG. 4 shows a schematic sectional view of an integrated thermoelectric structure in accordance with a third embodiment of the present invention. The integrated thermoelectric structure 400 comprises a substrate 410, a layer 420, at least two spacers 430, 440, a reflector 460 and at least two conductive areas 480, 485. The first spacer 430, in a top region facing away from the substrate 410, turns into a first layer portion of the layer 420. The second spacer 440, also in a top region facing away from the substrate 410, turns into a second layer portion of the layer 420. The first layer portion and the second layer portion here may contact and/or overlap each other and/or be electrically connected to each other.

This offers the advantage that the layer 410 is not processed in a separate step, but that manufacturing a layer portion of the layer 420 may take place at the same time as processing the first spacer 430 and processing another layer portion of the layer 420 may take place in connection with processing the second spacer 440. It would be possible, by omitting a transition resistance from the layer 420 to the respective spacers 430, 440, for these to be contacted electrically or connected in a better way and for the mechanical stability of the spacers 430, 440 to be increased. It is also conceivable that the layer 420 is kept at a desired distance in a mechanically more stable manner by this type of processing, since a layer portion of the layer 420 may be a component of the first spacer 430, or be made of the same material like the "vertical" part of the spacer, i.e. the lateral area, and another layer portion of the layer 420 may be a component of the second spacer 440. A considerable improvement in mechanical stability could be achieved by this "integral" characteristic.

Apart from this, at least one further improvement of the integrated thermoelectric structure 400 illustrated in FIG. 4 is conceivable. In order to obtain an infrared detection application, for example, using the integrated thermoelectric structure, the layers of the support structures or the first layer portion of the first spacer 430 and the second layer portion of the second spacer 440 may overlap as described above so as to obtain electrical contact and at the same time form a layer 420 (membrane) which may ideally exhibit a resistance of 377 Ω/sq, with a tolerance of +1-10%, for example. Reflection of the incident light may be prevented by this electrical layer resistance. At the same time, a reflector layer is to be applied at a distance $(2n-1)\lambda/4$, for n=1 or a multiple of n (natural numbers) (distance between the reflector layer 460 and the (absorption) layer 420). Thus, λ is the wavelength to be detected.

The reflector 460, or reflector layer, exemplarily exhibits a low electrical resistance of only a few Ω/sq, for example less than 10 Ω/sq, in order to prevent radiation from being absorbed at this position and maximize reflections. Due to this resonator structure, high absorption is achieved in the top thin layer 420 (membrane) and same is heated effectively. The integrated thermoelectric structure 400 may be described briefly such that an absorption layer 420 is made up of the active materials 1 and 2, with a suitable electrical resistance and electrical connection of the two materials at the membrane, i.e. the layer 420.

The reflector 460 may, for example, be implemented to be an area with holes. The spacers 430, 440 protrude through these holes. Thus, it is also feasible for the reflector 460 to comprise several sub-regions which may be separate from one another, for example in order to be able to process the reflector 460 better or be able to remove a sacrificial layer maybe provided for manufacturing the reflector 460 better after manufacturing.

The spacers 430, 440 as shown in FIG. 4 exemplarily correspond to the spacers 230, 240 of FIG. 2, the spacers 130, 140 of FIG. 1 and, exemplarily, also the spacer 300 in FIG. 3, except for the fact that the spacer 300 in FIG. 3 does not reveal the base area and the top area. However, it may be stated that it is desired for the spacers 430, 440 to meet the basic characteristics and tasks of the spacers as described herein.

Figure 5:
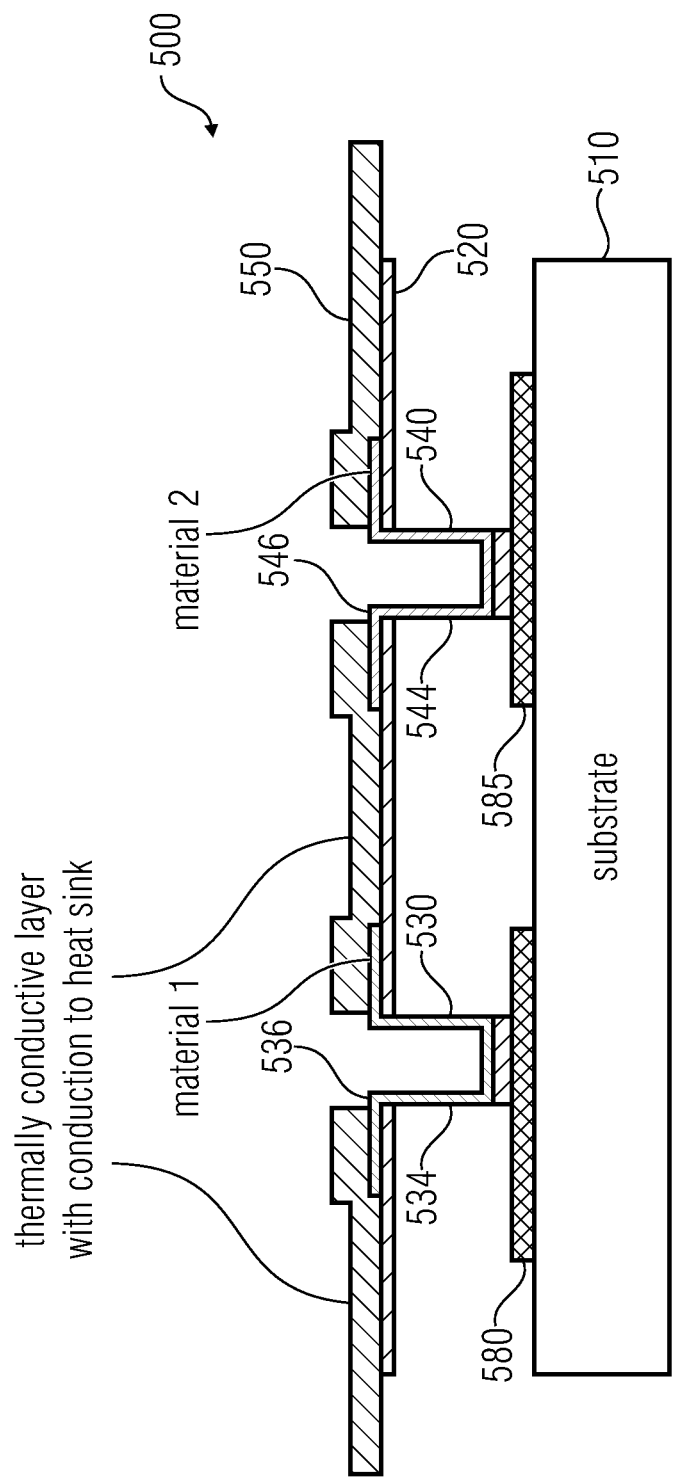
FIG. 5 is a schematic sectional view of an integrated thermoelectric structure in accordance with a fourth embodiment of the present invention.

Embodiment in Accordance with FIG. 5

FIG. 5 shows a schematic sectional view of an integrated thermoelectric structure 550 in accordance with a fourth embodiment of the present invention. The integrated thermoelectric structure 500 comprises a substrate 510, a layer 520, at least two spacers 530, 540 with associated lateral areas 534, 544 and associated top areas 536, 546. In addition, the integrated thermoelectric structure 500 comprises a heat-conducting element 550 which is coupled thermally to the layer 520, for example applied on the layer or applied as a further layer on the layer 520 in order to conduct heat to the layer 520 or conduct heat away from the layer 520.

Furthermore, the integrated thermoelectric structure 500 comprises at least two conductive areas 580, 585 which are associated to the respective spacers 530, 540. These conductive layers 580, 585 may not only be contacts of another circuit, but due to their setup they may also result in an increased mechanical stability of the spacers 530, 540 or contribute to an improved mechanical connection to the substrate 510, for example.

The embodiment may allow many different applications. It would, for example, be feasible for heat to be dissipates from circuits or elements present in the substrate or on the substrate. Thus, a current across the spacers 530, 540 may be impressed via the conductive areas 580, 585, thus acting as a Peltier element and being able to transport heat from the substrate 510 to the layer 520, for example. In other words, the integrated thermoelectric structure 500 offers a way of using same as a Peltier cooler, for example, or thermoelectric generator, wherein the top side, i.e. the layer 520 comprising the heat-conducting element 550 may, for example, serve as a heat sink. Thus, the layer 520 (membrane) may, for example, be connected to additional through-contactings (metal vias) or other suitable heat-conducting materials for removing heat, in order to cool local heat sources or convert waste heat from transistors, for example, to electrical energy by the Seebeck effect. The lines may then lead to a thermally uncritical region of the integrated circuit (of the ICs) and be removed to the outside from there via bond wires.

This would, for example, be important with thermally poorly conducting or thinned silicon substrates where heat dissipation via the substrate cannot take place sufficiently. The scenario of application may, for example, be described such that the absorption layer, i.e. the layer 520, maybe including the thermally conductive layer 550, becomes a heat sink for heat produced in the substrate 510, for example by transistors and allows an energy production/retrieval via the active materials 1 and 2, i.e. via the spacers 530 and 540 or the conductor structures thereof.

The spacers 530, 540 as shown in FIG. 5 exemplarily correspond to the spacers 230, 240 in FIG. 2, the spacers 130, 140 of FIG. 1 and also the spacer 300 in FIG. 3, for example, except for the fact that the spacer 300 in FIG. 3 does not reveal the base area and the top area. However, it may be stated that it is desired for the spacers 530, 540 to meet the basic characteristics and tasks of the spacers as described herein.

Figure 6:
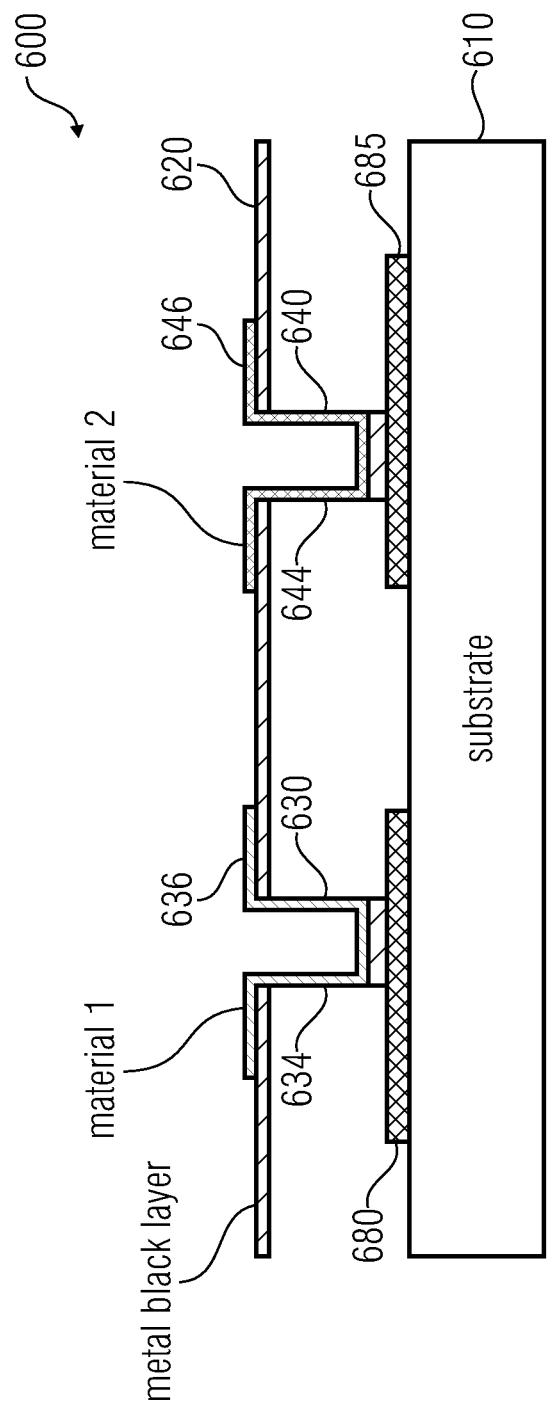
FIG. 6 is a schematic sectional view of an integrated thermoelectric structure in accordance with a fifth embodiment of the present invention.

Embodiment in Accordance with FIG. 6

FIG. 6 shows a schematic sectional view of an integrated thermoelectric structure in accordance with a fifth embodiment of the present invention. The integrated thermoelectric structure 600 comprises a substrate 610, a layer 620 and at least two spacers 630, 640. A first spacer 630 comprises a lateral area 634 and a top area 636. A second spacer 640 also comprises a lateral area 644 and a top area 646. Also illustrated are a first conductive area 680 and a second conductive area 685. In the embodiment illustrated, the layer 620 comprises a radiation absorption coefficient of at least 0.5.

The radiation absorption coefficient here is dependent on the radiation emissivity c which indicates the fraction of the power emitted compared to a black radiator, or equals the radiation emissivity. In the case of an infrared detection application, the layer 620 (membrane) may be made of a material of high radiation absorption in a suitable or desired wavelength range, for example 2 µm to 20 µm. There would be metal black layers, for example, as an example of broadband absorption, i.e. absorption not dependent on the wavelength (for example gold black, silver black, etc.).

Metal black layers may additionally also be used for thermoelectric generator applications, wherein, depending on the desired radiation source and desired operating range, the wavelength of 200 nm to 2 µm is of importance for solar radiation and 2 µm to 20 µm for infrared radiation. When being used as a thermoelectric generator, the layer 620 (membrane), like for an infrared application, may function as a collector which exemplarily heats up by the solar radiation or infrared radiation and thereby generates electrical energy via the Seebeck effect. From a thermal point of view, the contact to the wafer serves as a heat sink, like in sensor applications as well. However, several elements (for example, thermocouples, pairs of spacers, for example) are now connected in series in order to increase the voltage achievable, for example connected in parallel, in order to increase the current achievable. Contacting in series and/or parallel via metal electrodes on the wafer would be conceivable. Briefly, an absorber structure with only a single broadband absorption layer made of metal black layers or one metal black layer, for example, can be realized by this.

The spacers 630, 640 shown in FIG. 6 exemplarily correspond to the spacers 230, 240 of FIG. 2, the spacers 130, 140 of FIG. 1 and also the spacer 300 in FIG. 3, for example, except for the fact that the spacer 300 in FIG. 3 does not reveal the base area and the top area. However, it may be stated that it is desired for the spacers 630, 640 to meet the basic characteristics and tasks of the spacers as described herein.

Figure 7:
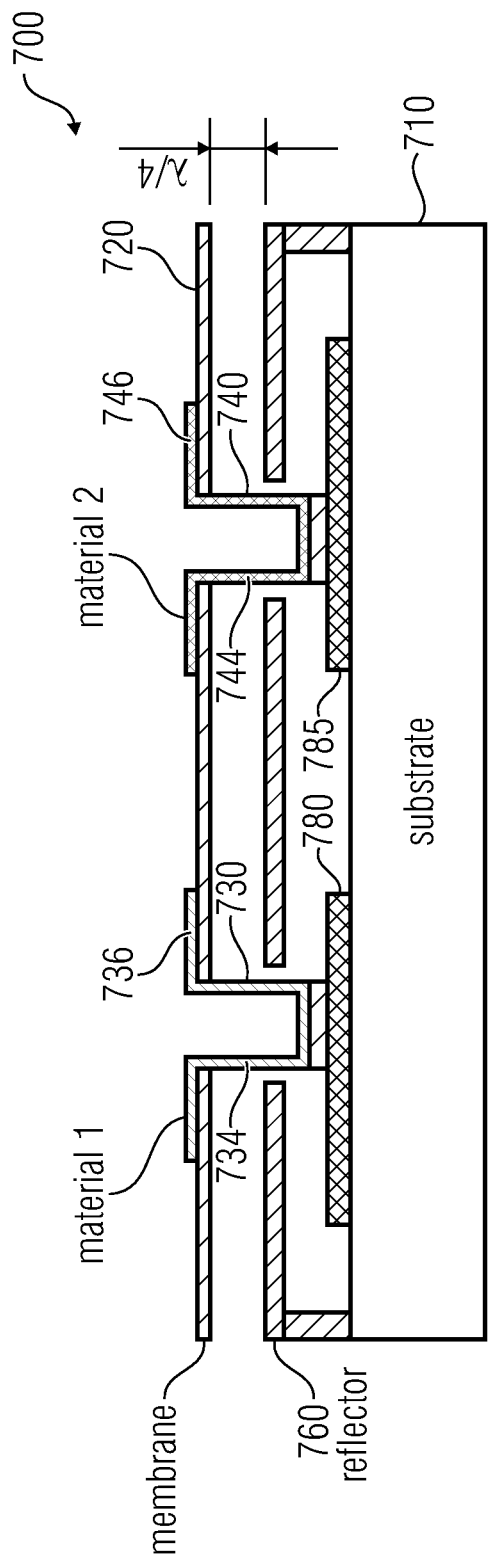
FIG. 7 is a schematic sectional view of an integrated thermoelectric structure in accordance with a sixth embodiment of the present invention.

Embodiment in Accordance with FIG. 7

FIG. 7 shows a schematic sectional view of an integrated thermoelectric structure 700 in accordance with a sixth embodiment of the present invention. The integrated thermoelectric structure 700 comprises a substrate 710, a layer 720 and at least two spacers 730, 740. A first spacer 730 comprises a lateral area 734 and a top area 736. A second spacer 740 also comprises a lateral area 744 and a top area 746. In addition, the integrated thermoelectric structure 700 comprises a reflector 760 arranged between the substrates 710 and the layer 720.

A resonant absorber structure for an infrared detection application which is made of an electrically conductive thin layer, i.e. the layer 720, with about 377 Ω/sq as a layer resistance, or comprises this thin layer may be realized using this arrangement. This layer 720 may, for example, be made of TiN, Ti, Al, W, Cu or similar materials. In a distance of $(2n-1)\lambda/4$ for n=1 or multiples of n (natural numbers), for integer values of n, for example, wherein $\lambda$ is the wavelength to be detected, a reflector layer, i.e. the reflector 760, is applied below the thin layer 720. The reflector 760, for example, is applied at a distance of 2.5 µm below the layer 720 for a (useful) wavelength of 10 µm. This reflector layer 760 comprises a small electrical resistance (a few $\Omega$) in order to prevent absorption of radiation at this position and maximize reflections. For this resonant structure, with a distance of, for example, $\lambda/4$ between the membrane, i.e. the layer 720, and the reflector 760, a metal, such as TiN, Ti, Al, W, Cu or similar, is possible for the material for the reflector 760. High absorption in the top thin membrane, i.e. the layer 720, is achieved by this resonator structure, and the same is heated effectively.

The spacers 730, 740 as shown in FIG. 7 exemplarily correspond to the spacers 230, 240 of FIG. 2, the spacers 130, 140 of FIG. 1 and also the spacer 300 in FIG. 3, for example, except for the fact that the spacer 300 in FIG. 3 does not reveal the base area and the top area. However, it may be stated that it is desired for the spacers 630, 640 to meet the basic characteristics and tasks of the spacers as described herein.

Figure 8:
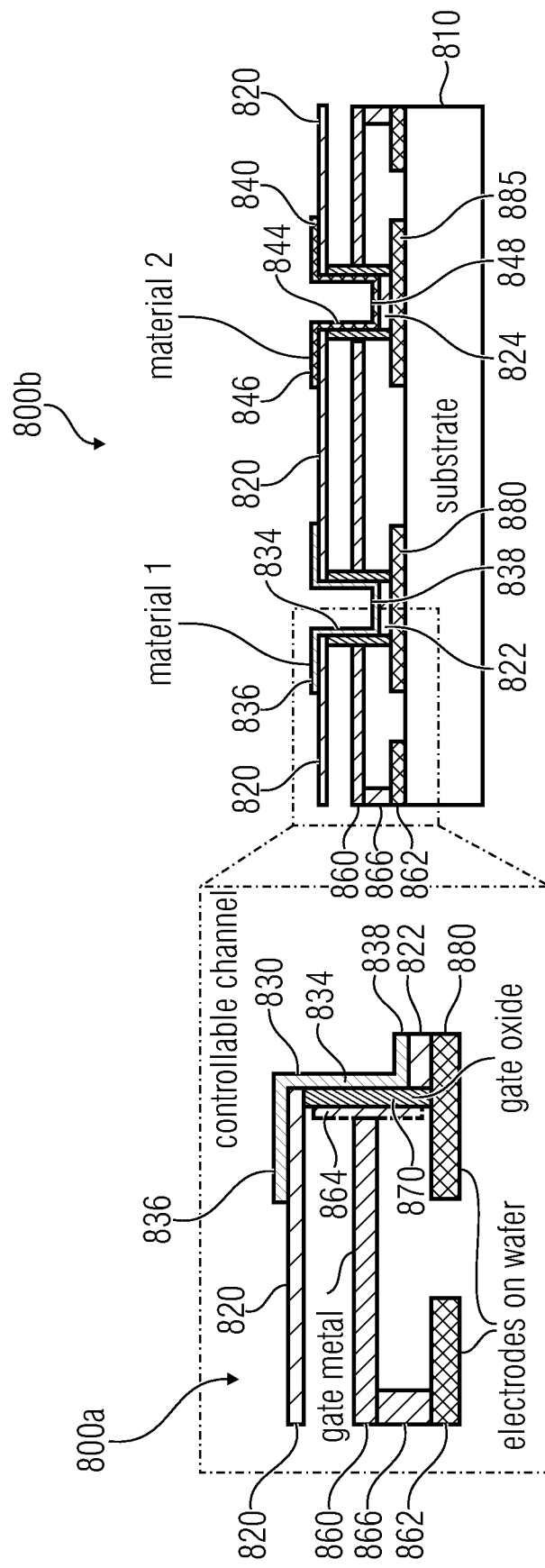
FIGS. 8a and 8b are a schematic sectional view of an integrated thermoelectric structure in accordance with a seventh embodiment of the present invention.

Embodiment in Accordance with FIGS. 8a and 8b

FIG. 8a shows a detail section 800a of a schematic sectional view of an integrated thermoelectric structure and FIG. 8b shows a schematic sectional view of an integrated thermoelectric structure 800b in accordance with a seventh embodiment of the present invention. Thus, FIG. 8a shows a detail section 800a of the integrated thermoelectric structure 800b of FIG. 8b. The section 800a comprises a first spacer 830, of which only the left sub-region is illustrated, having a lateral area 834, a top area 836 and a base area 838. In addition, the section 800a comprises the conductive area 880 which may be associated to the spacer 830 and which may be arranged between another area 822 which may, for example, result from manufacturing the layer 820 and may, for example, correspond to the further layer 222 of FIG. 2, and a substrate. In other words, the layer 822 is located between the base area 838 of the spacer and the conductive area 880, wherein the conductive area 880 is arranged directly on the substrate 810 or separated from the same by one or several layers.

In addition, the section comprises a layer 820 and a reflector 860 having a respective conductive area 862. The conductive area 862 may, for example, be a contact of a respective circuit which allows providing the reflector 860 with an electrical potential. Furthermore, the reflector 860 is kept at a distance to the substrate by a spacer 866, or the conductive area 862, i.e. the reflector 860 may, for example, rest on a column which corresponds to the spacer 866 and is grown on the conductive area 862. In addition, the reflector 860 comprises a conductive area 864 which is referred to as gate and which has the task of increasing a gate area, for example. The result may be that the gate area 864 together with the reflector 860 forms a T-shape in cross-section, wherein the top part of the lying T-shape represents the gate area 864. This gate area 864 may then exemplarily extend around the spacer 830, or the lateral area 834 thereof, in a ring-shaped implementation. Here, an insulating layer 870 may be practically provided between the gate area 864 and the lateral area 834. With the layer order described—reflector 860, followed by the conductive (gate) area 864 contacted by the reflector, the insulating layer 870 and the conductive lateral area 834—this structure may be interpreted to be a vertical field-effect transistor, wherein it may be assumed that a thickness of the insulating layer 870, a thickness of the lateral area 834 and a charge carrier concentration in the conductive lateral area 834 exemplarily are selected so as to allow a (significant) influence of electrical characteristics of the lateral area 834 by a potential applied to the gate area 864.

Thus, using a selected potential of the reflector 860, an electrical characteristic of the lateral area 834 of the spacer 830 may, for example, be influenced, and thus an electrical characteristic of the spacer 830 be influenced. Influencing the charge carrier concentration or the charge carrier flow would, for example, also be conceivable.

FIG. 8b shows a schematic illustration of an integrated thermoelectric structure 800b. The integrated thermoelectric structure comprises a substrate 810 and a layer 820. In addition, a first spacer 830 having a respective lateral area 834, top area 836 and base area 838 is illustrated here. A first conductive area 880 which may, for example, represent a contact to evaluating electronics is associated to the first spacer 830. In addition, a second spacer 840 having a respective lateral area 844, top area 846 and base area 848 is illustrated. A second conductive area 885 which may, for example, represent a contact to evaluating electronics is associated to the second spacer 840. Additionally, a reflector 860 including a respective conductive area 862 is shown. This reflector 860 basically comprises the same set up as the reflector 860 in FIG. 8a, which means that it also rests on a column 866. What cannot be recognized in the representation 800b is the gate, i.e. the succession of the conductive (gate) area 864 and the insulating layer 870, followed by the lateral area 834 of the first spacer 830.

The usage of the gate structure may be described as follows: via an electrical contact, i.e., for example, via the conductive layer 862, on the wafer to the reflector 860, for example, via the spacers 866 of the reflector 860, the reflector 860 may be used as a gate of a vertical MOS transistor. By this gate, the charge carrier flow or charge carrier concentration in the spacer 830 may thus be controlled via an electrical field, and by a similar structure also in the spacer 840, or in the respective spacer material, wherein electrical and thermal characteristics and the Seebeck coefficient may be influenced by this in a temporally modulated manner.

Thus, the geometry or dimensions of the reflector area 860, the conductive gate area 864, the insulating layer 870 and the conductive part of the lateral area 834 may be configured such that a field effect which allows the electrical characteristics of the conductive region of the spacer 830 to be influenced, occurs by applying a voltage, for example relative to a reference potential of the spacer 830, to the reflector 860 in a conductive region of the spacer 830.

It would be conceivable for the entire reflector 860 or, in case several separate reflectors 860 were processed, all the reflectors 860 to be provided with the same potential, and, thus, for all the spacers 830, 840 to be influenced approximately equally. However, with corresponding processing, it is also possible to set several reflectors 860 at different potentials so as to specifically influence different spacers 830, 840 differently.

In this context, it would also be conceivable to influence the Seebeck coefficients of the individual spacers 830, 840 such that there is no longer a thermoelectric effect. An improved total heat conduction may be achieved by this.

It would, for example, also be feasible to use the reflectors, or gate structures 860, as a shutter for resetting, or to use same for improved heating. Only additional metal electrodes, i.e. the conductive areas 862, are, for example, provided on the wafer, using which an electrical potential can be applied to the gate. FIG. 8a illustrates the gate oxide 870 in a light grey color which is optionally included already as a step as a protection from release process when manufacturing, compare the optional step in step (12) in the section "process flow of a manufacturing method".

In order to increase the active gate area, additionally, a metal may, for example, be deposited using atomic layer deposition before the gate oxide 870, for example insulated from an external circumference of the spacer 830 by the gate oxide 870, so that the result is the structure referred to as conductive (gate) area 864. Ti or TiN may, for example, be used here. This structure 864 is indicated in FIGS. 8a and 8b by a broken-line region to the left of the gate oxide, i.e. the insulating structure 870.

Expressed briefly, the arrangement described represents an extension of the resonator structure by a gate at the reflector which, via the gate oxide, has a controlling effect on the charge carrier transport, or charge carrier concentration, in materials 1 and 2.

The structure referred to in the embodiment as reflector 860 may, of course, also be used as only a controlling gate for influencing the behavior of the spacers 830, 840, without the structure 860 acting as a reflector. Thus, the reflector 860, i.e. the distinct reflector area 860, may, for example, be implemented to be different and may be manufactured to be mechanically more stable and lighter.

The spacers 830, 840 shown in FIGS. 8a and 8b exemplarily correspond to the spacers 230, 240 of FIG. 2, the spacers 130, 140 of FIG. 1 and, for example, also to the spacers 300 in FIG. 3, except for the fact that this spacer 300 in FIG. 3 does not reveal the base area and the top area. However, it may be stated that it is desired for the spacers 830, 840 to meet the basic characteristics and tasks of the spacers as described herein.

Manufacturing Method

Figure 9:
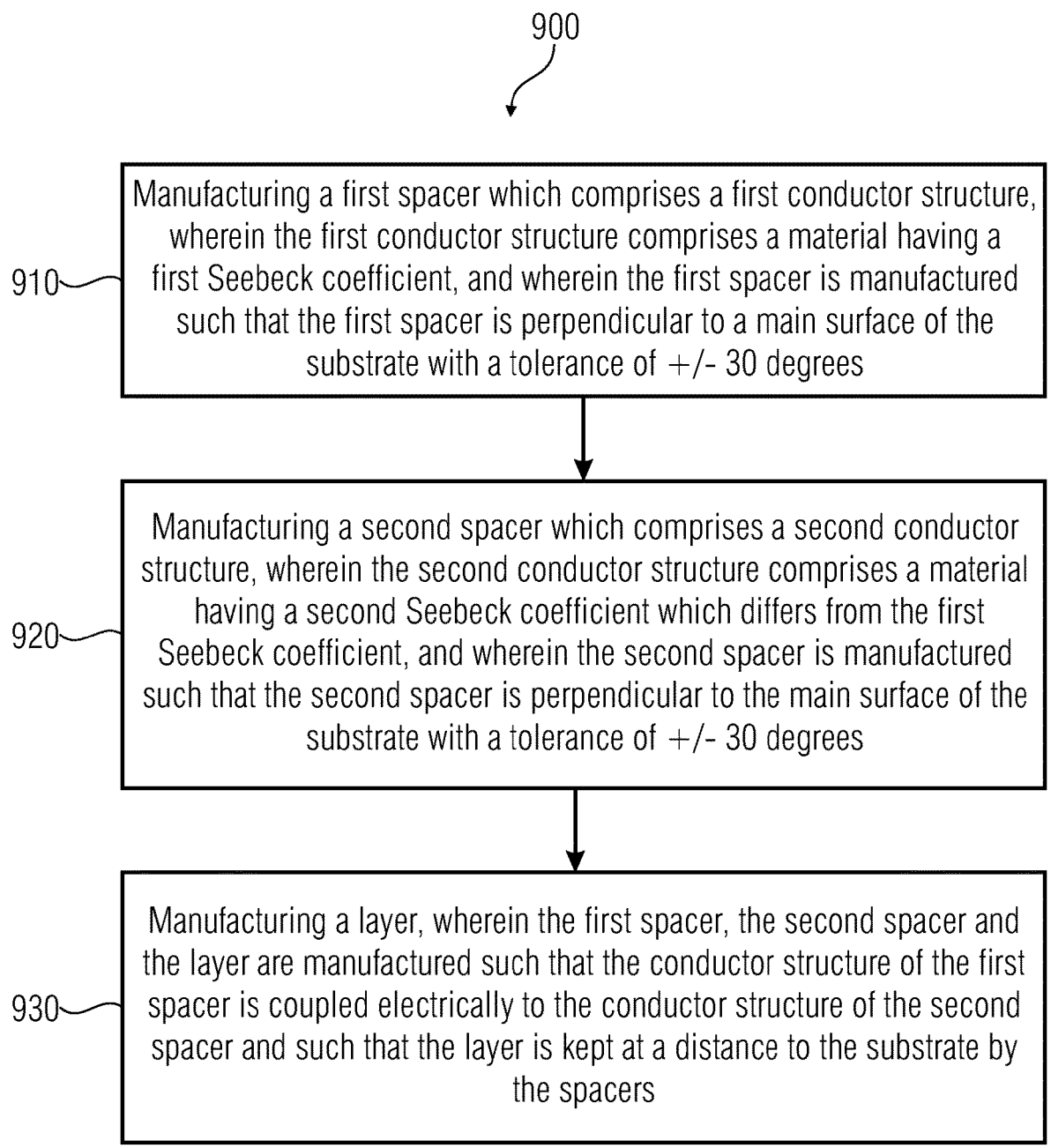
FIG. 9 is a flow chart of a method in accordance with an embodiment of the present invention.

A method 900 for manufacturing an integrated thermoelectric structure will be discussed below making reference to FIG. 9. The method 900 comprises, in step 910, manufacturing a first spacer which comprises a first conductor structure, wherein the first conductor structure comprises a material having a first Seebeck coefficient, and wherein the first spacer is manufactured such that the first spacer is perpendicular to a main surface of the substrate with a tolerance of +1-45 degrees.

In addition, the method 900 comprises, in step 920, manufacturing a second spacer which comprises a second conductor structure, wherein the second conductor structure comprises a material having a second Seebeck coefficient which differs from the first Seebeck coefficient, and wherein the second spacer is manufactured such that the second spacer is perpendicular to the main surface of the substrate with a tolerance of +1-45 degrees.

Furthermore, the method 900, in step 930, comprises manufacturing a layer, wherein the first spacer, the second spacer, and the layer are manufactured such that the conductor structure of the first spacer is coupled electrically to the conductor structure of the second spacer, and such that the layer is kept at a distance to the substrate by the spacers.

Subsequently, some details of the method for manufacturing an integrated thermoelectric structure as described above will be discussed. In the method, the layer is, for example, manufactured before the spacers. Thus, before manufacturing the spacers, the layer is supported by a sacrificial layer. Manufacturing the first spacer comprises the following step: applying the material having the first Seebeck coefficient so that the material having the first Seebeck coefficient contacts the layer from above and extends through a first opening in the layer and through a first opening in the sacrificial layer to the substrate or to a layer applied on the substrate.

Manufacturing the second spacer comprises the following step: applying the material having the second Seebeck coefficient so that the material having the second Seebeck coefficient contacts the layer from above and extends through a second opening in the layer and through a second opening in the sacrificial layer to the substrate or to a layer applied on the substrate.

The sacrificial layer is removed after manufacturing the first spacer and the second spacer. Manufacturing the embodiments as shown in FIGS. 1 to 8 is made possible by the method described.

A further method for manufacturing an integrated thermoelectric structure will be discussed below. In the method, an integrated circuit is formed on the substrate before manufacturing the spacers. Thus, an evaluating circuit for a signal from the integrated thermoelectric structure may, for example, be formed.

Figure 11:
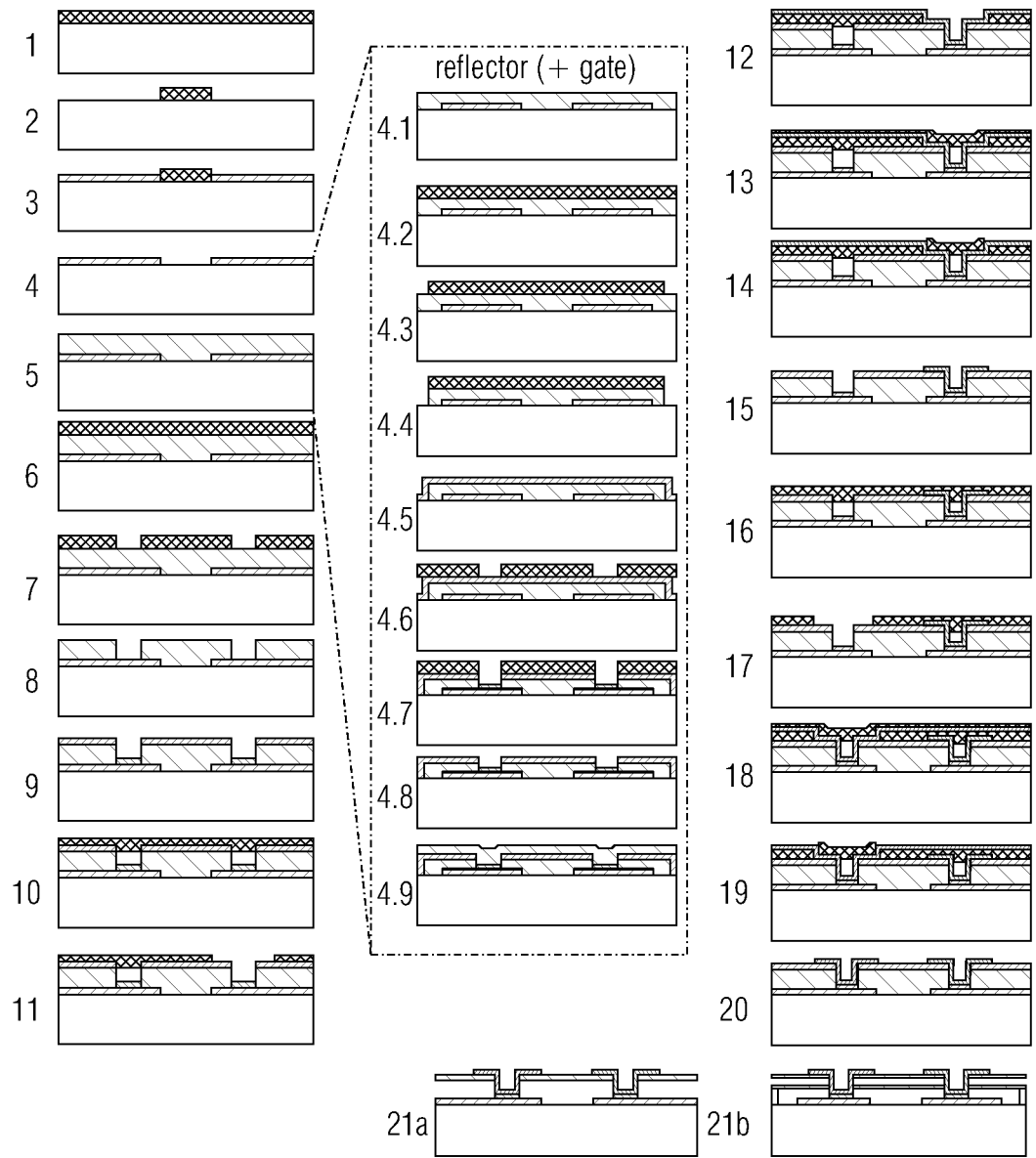
FIG. 11 is a graphical illustration of a process flow for manufacturing an integrated thermoelectric structure.

Process Flow of a Manufacturing Method in Accordance with FIG. 10 and FIG. 11

FIG. 10 shows a process flow for manufacturing an integrated thermoelectric structure in a tabular chart, FIG. 11 shows a respective graphical representation of the process flow. The steps will be discussed below. The temporal succession of process steps represented there is not true in general, but merely represents one possibility of implementing same. The process flow comprises the following steps:

In the first steps (1-4) illustrated, patterning of metal electrodes, i.e., for example, the conductive areas 880, 885 illustrated in FIGS. 8a and 8b, on the wafer which, for example, corresponds to the substrate 810 in FIGS. 8a and 8b, takes place. The conductive area 862, i.e. the contact for the gate 860, may also be processed in this step. Furthermore, electrical contacts, for example to evaluating electronics in or on the substrate 810 processed before, may also be processed in this step.

The steps (4.1-4.8) represented below describe manufacturing the optional reflector 860 and/or the optional gate structure 860. A sacrificial material, such as, for example, polyimide, Si, SiO2 or nitride, may, for example, be applied on the substrate 810 at a desired height or thickness, by means of which is determined the future height of the reflector 860 above the substrate 810 or conductive layer 862. In addition, holes can be patterned which allow manufacturing the spacers 866 of the reflector layer 860. Metallization may, for example, take place by means of ALD or physical vapor deposition, also referred to as PVD, so that the result is, for example, a layer having an electrical resistance of only a few ohm as the reflector 860. After manufacturing the reflector 860, holes may, for example, be processed in the reflector structure 860 which may, for example be used for subsequent patterning of the spacers 830, 840. Holes are patterned into the metal layer of the reflector 860, for the spacers 830, 840 of the membrane, i.e. of the layer 820. Subsequently, deep-etching down to the contact areas 880, 885 on the substrate 810, for example, takes place. An optional reflector structure can be processed using these steps.

After these optional process steps, a further process step (5 or 4.9) may take place which serves particularly for manufacturing the layer 820. A sacrificial material, for example polysilicon, may be applied (again) so that a desired distance to the reflector 860, like, for example, $\lambda/4$, with $\lambda$ being the wavelength of a spectral radiation maximum to be detected, is set, or so that a desired distance to the substrate 810 results which may, for example, be in an order of magnitude or in a range between 8 μm and 12 μm. In other words, the thickness of the sacrificial material defines the distance between the layer 820 and the reflector 860, or substrate 810.

Further steps (6-8) may, for example, be for holes to be processed again and subsequently, for manufacturing the spacers 830, 840 to be prepared by deep-etching down to the contacts 880, 885. If the optional resonator structure 860 is present, the holes may, for example, be processed at those positions where these have already been provided during processing the reflector 860, i.e. at those positions where holes have already been patterned in the reflectors 860, i.e. in steps (4.6 to 4.8).

In addition, step (9) is illustrated which serves for manufacturing the layer 820. Manufacturing may, for example, take place by means of PVD, wherein a metal, like Al or Ti, is used, for example. It is to be kept in mind here that the lateral sides of the holes which serve for manufacturing the spacers 830, 840 are not coated. These process steps may take place at a later point in time, for example after manufacturing the spacers, wherein it may, for example, be determined by selecting the order whether the layer 820 is above or below the top layer 836, 846 of the spacers 830, 840.

A further step (10) serves sealing the holes patterned for processing the spacers 830, 840, near the surface. A photoresist may, for example, be used here. Furthermore, suitable SiO2 processes may also be used.

In a further step (11), a hole is opened for further processing, i.e. for manufacturing a first spacer 830, by exposing and etching.

In the following step (12), a first material (material 1) having a first Seebeck coefficient may be applied by coating by means of ALD, for processing the first spacer 830. The result is, for example, a pipe, i.e. the first spacer 830, in the hole patterned before. An optional step may in this context be performed using Al2O3, for example. Thus, an Al2O3 layer is manufactured by means of ALD which serves as a protection of the active thermoelectric ALD layer which forms the spacer 830. This Al2O3 layer may be a protection from a future release step. Thus, the Al2O3 layer may be applied as a protective layer, before and/or after ALD of the spacer materials, for example. This step may, for example, be executed before and/or after processing the first spacer 830. Coating the side areas of the holes may, for example, be desirable here in order to protect the lateral area 834 of the spacer 830. The Al2O3 layer may, for example, also represent the insulating layer 870 of the field-effect transistor. The layer which exemplary forms the base area 838 of the first spacer 830, the lateral area 834 of the first spacer 830, and the top area 836 of the first spacer 830 may, for example, be applied such that the walls of the opening provided for the first spacer 830 are reliably coated continuously and such that the thermoelectric layer which forms the first spacer 830 contacts the layer 820 in the surroundings of the opening provided for the first spacer 830.

In subsequent steps (13-15), the ALD layer, not required, of material 1 of the first spacer 830 and regions, not required, having photoresist or SiO2, for example, may be removed.

A further step (16) serves for sealing the holes which have been patterned for processing the spacers 830, 840, near the surface. Thus, a photoresist may be used, for example, or suitable SiO2 process may be used, for example.

In a further step (17), a hole is opened for further processing, i.e. for manufacturing the second spacer 840, by means of exposing and etching.

In the following step, a second material (material 2) having a second Seebeck coefficient may, for example, be applied by coating by means of ALD, for processing the second spacer 840. The result is a pipe, for example, i.e. the second spacer 840, in the hole patterned before. An optional step may be performed in this context, using Al2O3, for example, or a different insulating and/or etching-resistant material. Thus, an Al2O3 layer is manufactured by means of ALD, which serves as a protection of the active thermoelectric ALD layer which forms the spacer 840. This Al2O3 layer may be a protection from a future release step. Thus, the Al2O3 layer may be applied as a protective layer, before and/or after ALD of the spacer materials, for example. This step may, for example, be executed before and/or after processing the second spacer 840. Coating the side areas of the holes may, for example, be desirable in order to protect the lateral area 844 of the spacer 840. The Al2O3 layer may, for example, also represent the insulating layer of the field-effect transistor.

In the following steps (18-20), the ALD layer, not required, of material 2 of the second spacer 840 and regions, not required, having a photoresist or SiO2, for example, may be removed.

The final step (21) may be for a "release" of the layer to take place, for example by etching away the sacrificial material layer, the result being a free-standing structure, for example. Thus, 21a shows a possible final result of the structure with manufacturing without a reflector and 21b shows a possible final result of the structure with manufacturing with the reflector 860 or gate.

Operating Method

A method for operating an integrated thermoelectric structure will be discussed below. The integrated thermoelectric structure comprises a substrate, a layer and at least two spacers. The spacers comprise conductor structures. The conductor structure of a first spacer comprises a material having a first Seebeck coefficient. The conductor structure of a second spacer comprises a material having a second Seebeck coefficient which differs from the first Seebeck coefficient. The spacers are perpendicular to a main surface of the substrate with a tolerance of +/−45 degrees, wherein an implementation with a tolerance of +/−30 degrees may be of advantage. In addition, the conductor structure of the first spacer is coupled electrically to the conductor structure of the second spacer. The spacers are additionally implemented in order to keep the layer at a distance to the substrate.

Furthermore, the integrated thermoelectric structure comprises a reflector which is arranged in a region between the layer and the substrate. Thus, the reflector comprises a top reflector area parallel to a main surface of the substrate with a tolerance of +/−10 degrees. In addition, radiation to be detected comprises a spectral maximum at a predetermined wavelength, wherein a distance between the reflector area and the layer, with a tolerance of 5% of the predetermined wavelength, equals an odd-numbered multiple of a fourth of the predetermined wavelength. It may be sensitive here for the distance to be, for example, selected such that the layer is located at the position of a wave loop of a standing wave forming by reflection of the radiation to be detected by the reflector. Thus, a wavelength selectivity, or high sensitivity, may be achieved, for example, with a spectral maximum. The reverse case would, of course, also be feasible, namely for the distance between the layer and the reflector to be selected such that a node of a standing wave forms a the position of the layer and, thus, this wavelength or frequency is excluded from detection.

A method for operating an integrated thermoelectric structure for radiation detection will be discussed below. The integrated thermoelectric structure realizes a detector for detecting electromagnetic radiation. An evaluating circuit is used here which is configured to evaluate an electrical voltage which results between substrate-side and/or layer-side terminals of the first spacer and the second spacer, in order to achieve information on heating of the layer caused by the incident electromagnetic radiation. Due to the layer heating up, the result, due to the Seebeck effect, is a voltage which may be measured between the spacers. Thus, radiation can be detected using this arrangement.

A method for operating an integrated thermoelectric structure as a generator will be discussed below. The integrated thermoelectric structure realizes a thermoelectric generator for transforming heat to electrical energy. Thus, a circuit is used which is configured to tap an electrical voltage which results between the substrate-side and/or layer-side terminals of the first spacer and the second spacer, in order to make available electrical energy. The Seebeck effect is made use of here again.

A method for operating an integrated thermoelectric structure for heat transport will be discussed below. The integrated thermoelectric structure realizes a thermoelectric Peltier element for transporting heat. A circuit is used here which is configured to impress an electrical current across the conductor structure of the first spacer and across the conductor structure of the second spacer, so as to transport heat. The so-called Peltier effect is made use of here which allows forming a temperature difference which forms in this case across the spacers. Thus, any side can be cooled or heated.

General Remarks on the Integrated Thermoelectric Structure

Further details which cannot be recognized in the embodiments, or not be recognized well, may be mentioned in relation with these embodiments. Due to the spatially separate setup of the spacers (material 1 and material 2 at different positions), these may easily be contacted electrically, both on the membrane, i.e. layer, side and on the substrate side, thereby making easy processing possible. In addition, the spacers may be processed on finished CMOS wafers, without having to remove the silicon from the actual wafer, i.e. with no sacrificial layer process as regards the substrate.

Additionally, the membrane, i.e. the layer, may be located both below and above the upper edge of the spacers. Consequently, this allows different processing orders. A temperature gradient relative to the substrate may be formed by the small heat conduction of the spacers when the membrane heats up due to infrared radiation, for example. A charge carrier gradient which is counteracted by an electrical field is generated by the temperature gradient which mainly forms across the spacer, in the materials 1 and 2, i.e. in the first spacer, or the conductor structure thereof, and in the second spacer, or the conductor structure thereof. The resulting voltage $U_{th}$ may be used as a measuring quantity or for gaining energy (Seebeck effect). See also FIG. 12.

Figure 12:
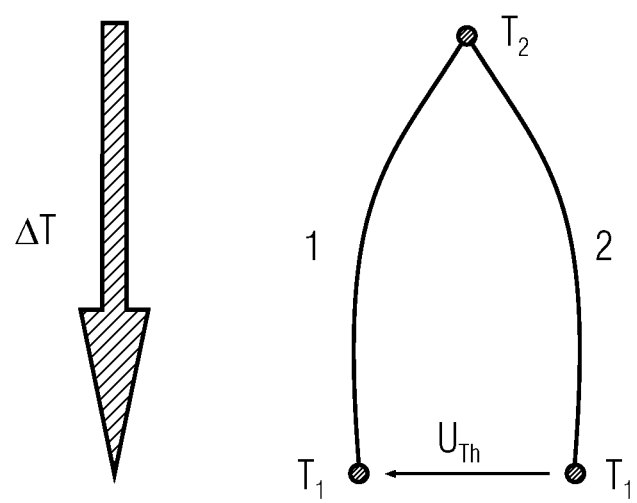
FIG. 12 shows a basic setup of a structure which may utilize of the Seebeck effect.

FIG. 12 shows a basic setup of a structure which is able to make use of the Seebeck effect. The different materials are represented by 1 and 2. The temperature difference is directed from the top (hot) downwards (cold). The voltage $U_{th}$ may be tapped, or applied, via electrical contacts of the spacers at the substrate surface, for example. If, however, a current is impressed in materials 1 and 2, the charge carrier concentration may be influenced by this and heat be "transported" (Peltier effect).

The entire thermal conductivity is determined by the thermal conductivities of the spacers and the number thereof and, ideally, is to equal the thermal emission for an optimum infrared sensor, i.e. $G_{s,th}=G_{th}\cdot N$. The spacers may be processed to be hollow on the inside and thin-walled and the overall diameter here is dependent only on the lithographic resolution used. Thus, very high heat insulation may be achieved and, thus, the sensor area be decreased with equal sensitivity.

However, the spacers do not only contribute to thermal insulation, but additionally, due to the difference of the individual Seebeck coefficients, be the active materials for temperature, infrared sensor, thermoelectric generators or Peltier cooling, for example. Materials, like ZnO, AZO and others, which exhibit the smallest possible thermal conductivities, high electrical conductivity and high Seebeck coefficients (for example as regards the magnitude thereof), with the largest possible absolute difference, are of advantage for these spacers. The result of this is that these materials are to exhibit the best possible thermoelectric quality factor zT. Among these possible materials, bismuth telluride is an example of a very good material for a spacer, since bismuth telluride exhibits a high quality factor for ambient temperature applications.

In addition, by implementing a THz antenna on the membrane, the measuring range may additionally be extended to the THz range, the THz antenna here replaces the absorber for heat radiation (for example for a certain frequency range).

Possible Fields of Application

Measuring far-infrared radiation, either as an individual sensor or an array, by thermoelectric sensors is to be improved by this invention and, particularly, be integrable in a microchip.

Lateral thermopiles which consume additional space can be avoided by this invention. The conventionally large sensor areas are caused by the well heat-conducting thermoelectric structures which are a few μm wide and thick and, for integrated thermopiles, mostly consist of doped polysilicon. In order to achieve the largest possible thermal insulation, the silicon wafer below the membrane is usually etched away. Silicon area is lost by this, which could have been used for further electronics.

Of advantage in the inventive integrated thermoelectric structure in contrast are a considerable reduced area consumption. Thus, the pixel arrays of an infrared sensor arrangement, for example, can be patterned to be considerably smaller, wherein the resolution of a sensor which is based on this technology may increase considerably with an equal area.

In addition, no further area, for example silicon area, of the substrate has to be sacrificed for the integrated thermoelectric structure, wherein this additional area (exemplarily below the layer) may be used for further integrated structures. Evaluating electronics for the thermopiles would be conceivable, for example. However, it is also conceivable for the integrated thermoelectric structure to be used as a Peltier element, for example as an active cooler, for structures processed in the substrate. This also shows that the invention presented exhibits considerable advantages compared to conventional, lateral thermopiles. Thermal connection here can be improved considerably, since the integrated thermoelectric structure may be grown directly on the substrate.

The integrated thermoelectric structure may, of course, also be used as a thermoelectric generator. The reduced area consumption and direct thermal connection to heat sources in the substrate are considerable advantages of the invention.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. An integrated thermoelectric structure, comprising:
a substrate; and
a layer; and
at least two free-standing spacers connecting the substrate and the layer, wherein the at least two spacers comprise conductor structures, wherein a conductor structure which is in a lateral area of a first spacer of the at least two spacers comprise a material comprising a first Seebeck coefficient; and
wherein a conductor structure which is in a lateral area of a second spacer of the at least two spacers comprises a material comprising a second Seebeck coefficient which differs from the first Seebeck coefficient; and
wherein axes of the at least two spacers are substantially perpendicular to a surface of the substrate with a tolerance of +/−45 degrees; and
wherein the conductor structure of the first spacer is coupled electrically to the conductor structure of the second spacer;
wherein the at least two spacers are configured to keep the layer at a distance to the substrate alone without relying on other support structures; and
wherein the at least two spacers comprise the lateral areas and are thin-walled tubes, hollow on the inside, wherein the wall thickness is less than or equal to 200 nm.

2. The integrated thermoelectric structure in accordance with claim 1, wherein at least one spacer of the at least two spacers comprises a base area, a lateral area and, in a region facing away from the substrate, a top area bordering on the lateral area, surrounding a central region of the at least one spacer of the at least two spacers, parallel to the surface of the substrate with a tolerance of +/−10 degrees.

3. The integrated thermoelectric structure in accordance with claim 1, wherein the first spacer and the second spacer are arranged next to each other.

4. The integrated thermoelectric structure in accordance with claim 2, wherein the top area of at least one spacer of the at least two spacers abuts on the layer in an overlapping manner so as to support and/or contact electrically the layer.

5. The integrated thermoelectric structure in accordance with claim 1, wherein the at least two spacers are grown on electrical contacts.

6. The integrated thermoelectric structure in accordance with claim 1, wherein the conductor structures of the first spacer and of the second spacer are electrically connected in series.

7. The integrated thermoelectric structure in accordance with claim 1, wherein the integrated thermoelectric structure comprises at least four spacers; and
wherein the conductor structures of the at least four spacers are connected in series; and
wherein two successive conductor structures in the series connection each comprise materials comprising different Seebeck coefficients.

8. The integrated thermoelectric structure in accordance with claim 1, wherein the conductor structures of the at least two spacers are contacted electrically on a side of the at least two spacers facing the substrate and/or on a side of the at least two spacers facing the layer.

9. The integrated thermoelectric structure in accordance with claim 1, wherein the conductor structure of the first spacer and the conductor structure of the second spacer form a thermoelectric couple by the difference in the specific Seebeck coefficients.

10. The integrated thermoelectric structure in accordance with claim 1, wherein the conductor structure of the first spacer and the conductor structure of the second spacer comprise materials the Seebeck coefficients of which differ by at least 30 µV/K.

11. The integrated thermoelectric structure in accordance with claim 1, wherein the thermoelectric structure comprises a heat-conducting element which is coupled thermally to the layer in order to conduct heat away from the layer or to conduct heat to the layer.

12. The integrated thermoelectric structure in accordance with claim 1, wherein the layer comprises a radiation absorption coefficient of at least 0.5.

13. The integrated thermoelectric structure in accordance with claim 1, wherein a further layer is applied on the layer; and
wherein the further layer comprises a radiation absorption coefficient of at least 0.5.

14. The integrated thermoelectric structure in accordance with claim 1, wherein a THz antenna is provided on the layer.

15. The integrated thermoelectric structure in accordance with claim 1, wherein a reflector is arranged in a region between the layer and the substrate.

16. The integrated thermoelectric structure in accordance with claim 15, wherein the reflector comprises a reflector area parallel to the surface of the substrate with a tolerance of +/−10 degrees.

17. The integrated thermoelectric structure in accordance with claim 16, wherein an edge of the reflector area is arranged as a control structure in order to allow an electrical characteristic of each spacer to be influenced.

18. The integrated thermoelectric structure in accordance with claim 16, wherein the reflector area is adjacent to at least one of the spacers in order to allow an electrical characteristic of the at least one of the spacers to be influenced; or
wherein the reflector area faces at least one of the spacers in order to allow an electrical characteristic of the at least one of the spacers to be influenced.

19. The integrated thermoelectric structure in accordance with claim 16, wherein an insulation layer, which allows an electrical characteristic of each spacer to be influenced is provided between the reflector area and a spacer.

20. A detector for detecting electromagnetic radiation, comprising:
    an integrated thermoelectric structure in accordance with claim 1;
    an evaluating circuit configured to evaluate an electrical voltage resulting between substrate-side and/or layer-side terminals of the first spacer and the second spacer in order to acquire information on layer heating caused by the incident electromagnetic radiation.

21. A thermoelectric generator for transforming heat to electrical energy, comprising:
    an integrated thermoelectric structure in accordance with claim 1;
    a circuit configured to tap an electrical voltage resulting between a substrate-side and/or layer-side terminals of the first spacer and the second spacer in order to make available electrical energy.

22. A thermoelectric Peltier element for transporting heat, comprising:
    an integrated thermoelectric structure in accordance with claim 1;
    a circuit configured to impress an electrical current across the conductor structure of the first spacer and across the conductor structure of the second spacer in order to transport heat.

23. An integrated thermoelectric structure, comprising:
    a substrate; and
    a layer; and
    at least two free-standing spacers connecting the substrate and the layer, wherein the at least two spacers comprise conductor structures, wherein a conductor structure which is in a lateral area of a first spacer of the at least two spacers comprise a material comprising a first Seebeck coefficient; and
    wherein a conductor structure which is in a lateral area of a second spacer of the at least two spacers comprises a material comprising a second Seebeck coefficient which differs from the first Seebeck coefficient; and
    wherein axes of the at least two spacers are substantially perpendicular to a surface of the substrate with a tolerance of +/−45 degrees; and
    wherein the conductor structure of the first spacer is coupled electrically to the conductor structure of the second spacer;
    wherein the at least two spacers are configured to keep the layer at a distance to the substrate alone without relying on other support structures; and
    wherein the at least two spacers comprise the lateral areas and are hollow tubes,
    wherein the at least two spacers comprise a wall thickness less than or equal to 200 nm, and
    wherein the at least two spacers comprise a height between 1.0 µm and 40 µm.

24. An integrated thermoelectric structure, comprising:
    a substrate; and
    a layer; and
    at least two free-standing spacers connecting the substrate and the layer, wherein the at least two spacers comprise conductor structures, wherein a conductor structure which is in a lateral area of a first spacer of the at least two spacers comprise a material comprising a first Seebeck coefficient; and
    wherein a conductor structure which is in a lateral area of a second spacer of the at least two spacers comprises a material comprising a second Seebeck coefficient which differs from the first Seebeck coefficient; and
    wherein axes of the at least two spacers are substantially perpendicular to a surface of the substrate with a tolerance of +/−45 degrees; and
    wherein the conductor structure of the first spacer is coupled electrically to the conductor structure of the second spacer;
    wherein the at least two spacers are configured to keep the layer at a distance to the substrate alone without relying on other support structures; and
    wherein the at least two spacers comprise the lateral areas and are hollow tubes having a wall thickness less than or equal to 200 nm,
    wherein the at least two spacers are produced using atomic layer deposition, and/or
    wherein the at least two spacers are grown on conductive areas.

* * * * *